(12) United States Patent
Kozuka

(10) Patent No.: US 12,431,323 B2
(45) Date of Patent: Sep. 30, 2025

(54) APPARATUS AND METHOD FOR MILLING SAMPLE

(71) Applicant: JEOL Ltd., Tokyo (JP)

(72) Inventor: Munehiro Kozuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 358 days.

(21) Appl. No.: 18/083,630

(22) Filed: Dec. 19, 2022

(65) Prior Publication Data

US 2023/0197401 A1 Jun. 22, 2023

(30) Foreign Application Priority Data

Dec. 20, 2021 (JP) .................................. 2021-205944

(51) Int. Cl.
*H01J 37/21* (2006.01)
*H01J 37/305* (2006.01)

(52) U.S. Cl.
CPC ............ *H01J 37/21* (2013.01); *H01J 37/305* (2013.01); *H01J 2237/083* (2013.01); *H01J 2237/20214* (2013.01); *H01J 2237/24578* (2013.01); *H01J 2237/30477* (2013.01); *H01J 2237/31749* (2013.01)

(58) Field of Classification Search
None
See application file for complete search history.

(56) References Cited

U.S. PATENT DOCUMENTS

| | | | |
|---|---|---|---|
| 2006/0157341 A1 | 7/2006 | Fujii | |
| 2008/0067377 A1* | 3/2008 | Hatakeyama | H01J 37/153 |
| | | | 250/310 |
| 2011/0248179 A1 | 10/2011 | Matesa, Jr. et al. | |
| 2017/0133195 A1* | 5/2017 | Yaguchi | H01J 37/20 |
| 2019/0115187 A1* | 4/2019 | Kawai | H01J 37/10 |
| 2020/0266028 A1 | 8/2020 | Kozuka | |
| 2022/0392744 A1* | 12/2022 | Kimura | G01N 1/286 |
| 2023/0162943 A1* | 5/2023 | Oh | G06F 16/2455 |
| | | | 250/311 |

FOREIGN PATENT DOCUMENTS

| | | | | |
|---|---|---|---|---|
| CN | 110676148 A | * | 1/2020 | |
| EP | 2911181 A1 | * | 8/2015 | ............ H01J 37/063 |
| JP | 200530799 A | | 2/2005 | |
| JP | 201921440 A | | 2/2019 | |
| JP | 2020135972 A | | 8/2020 | |

OTHER PUBLICATIONS

English machine translation for CN-110676148-A (Year: 2020).*
Extended European Search Report issued in EP22214627.6 on May 16, 2023.
Office Action issued in JP2021205944 on Oct. 31, 2023.

* cited by examiner

*Primary Examiner* — Robert H Kim
*Assistant Examiner* — Alina Kaliszewski
(74) *Attorney, Agent, or Firm* — The Webb Law Firm

(57) ABSTRACT

Provided is a sample milling apparatus capable of milling various samples efficiently. The sample milling apparatus includes an anode, a cathode for emitting electrons which are made to collide with gas molecules so that ions are generated, an extraction electrode for causing the generated ions to be extracted as an ion beam, and a focusing electrode disposed between the cathode and the extraction electrode and applied with a focusing voltage. The spatial profile of the ion beam is controlled by varying the focusing voltage applied to the focusing electrode.

11 Claims, 27 Drawing Sheets

| | Forecast Milling Time |
|---|---|
| Milling Condition 1 | 1:00 |
| Milling Condition 2 | 1:00 |
| Total | 2:00 |

APPARATUS AND METHOD FOR MILLING SAMPLE

CROSS REFERENCE TO RELATED APPLICATION

This application claims priority to Japanese Patent Application No. 2021-205944, filed Dec. 20, 2021, the disclosure of which is hereby incorporated by reference in its entirety.

BACKGROUND OF THE INVENTION

1. Field of the Invention

The present invention relates to an apparatus and method for milling a sample.

2. Description of the Related Art

A Cross Section Polisher (a trademark registered) for milling sample cross sections, an Ion Slicer (a trademark registered) for preparing thin film samples, and others are known as apparatus for milling samples using an ion beam.

In such a sample milling apparatus, a Penning ion source is used as its ion source. For example, JP-A-2020-135972 discloses a Penning ion source which includes a cylindrical anode, two mutually opposite cathodes, and an extraction electrode. In the Penning ion source, an acceleration voltage is applied between the anode and the extraction electrode, and a discharge voltage is impressed between the anode and the cathodes.

In the ion source of JP-A-2020-135972, if argon gas is supplied into the space (ionization chamber) formed by the cylindrical anode, the argon gas molecules collide with electrons released from the cathodes and become ionized. The resulting ions are accelerated by the acceleration voltage applied between the anode and the extraction electrode and released as an ion beam through electrode holes formed in the cathodes.

In an apparatus for milling samples, the samples to be milled vary widely in terms of material, target size, and target depth. Therefore, there is a need for a sample milling apparatus capable of efficiently milling such various samples.

SUMMARY OF THE INVENTION

One aspect of the sample milling apparatus associated with the present invention operates to mill a sample by irradiating it with an ion beam and comprises an anode, a cathode for emitting electrons which are made to collide with gas molecules so that ions are generated, an extraction electrode for causing the generated ions to be extracted as the ion beam, and a focusing electrode disposed between the cathode and the extraction electrode and applied with a focusing voltage. The ion beam has a spatial profile that is controlled by varying the focusing voltage applied to the focusing electrode.

In this sample milling apparatus, the spatial profile of the ion beam can be controlled by varying the focusing voltage applied to the focusing electrode and, therefore, various kinds of samples which vary in material, target size, target depth, and so on can be milled efficiently.

One aspect of the sample milling method associated with the present invention is implemented by the use of a sample milling apparatus comprising an anode, a cathode for emitting electrons which are made to collide with gas molecules so that ions are generated, an extraction electrode for causing the generated ions to be extracted as an ion beam, and a focusing electrode disposed between the cathode and the extraction electrode and applied with a focusing voltage. A sample is milled by irradiating it with the ion beam having a spatial profile. The method comprises the step of controlling the spatial profile of the ion beam by varying the focusing voltage applied to the focusing electrode.

In this sample milling apparatus, the spatial profile of the ion beam is controlled by varying the focusing voltage applied to the focusing electrode and, therefore, various kinds of samples which vary in material, target size, target depth, and so on can be milled efficiently.

DESCRIPTION OF THE INVENTION

The preferred embodiments of the present invention are hereinafter described in detail with reference to the drawings. Note that the embodiments provided below are not intended to unduly restrict the contents of the present invention delineated by the claims and that not all the configurations set forth below are essential constituents of the present invention.

1. First Embodiment 1.1. Sample Milling Apparatus

Figure 1:
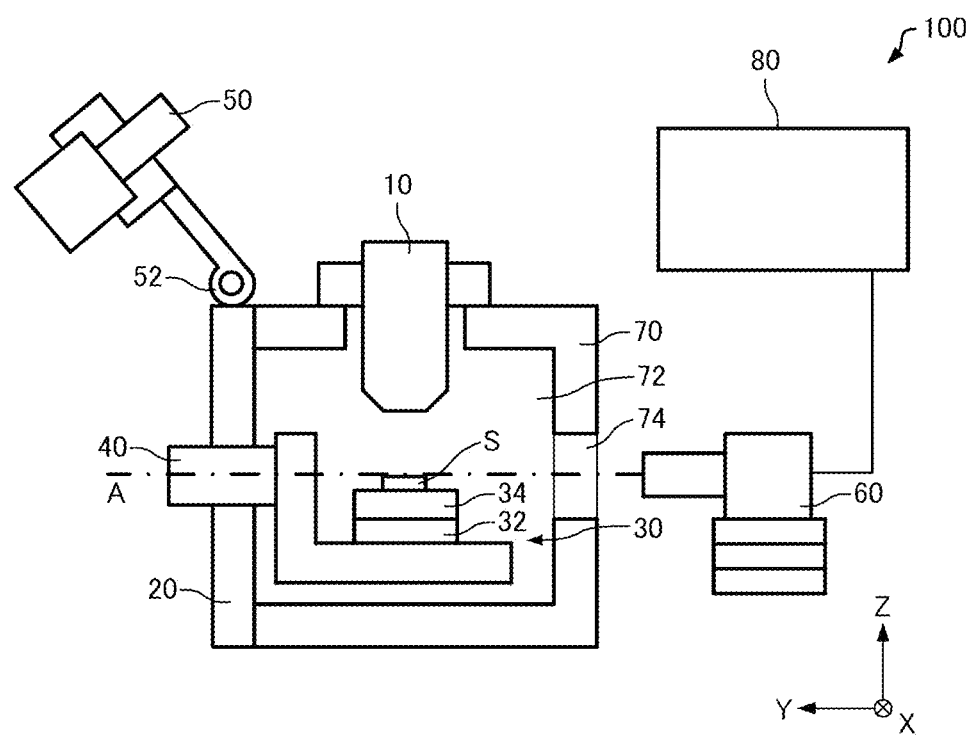
FIGS. 1 and 2 are diagrams showing the configuration of a sample milling apparatus associated with a first embodiment of the present invention, illustrating different operational states.
Figure 2:
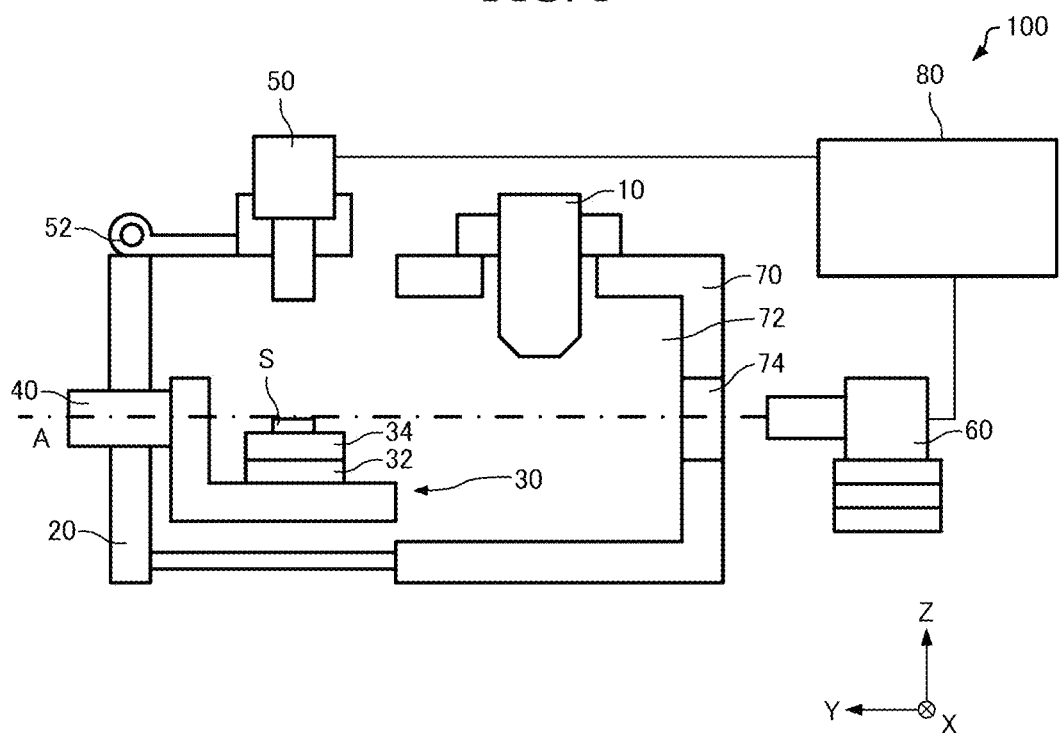

A sample milling apparatus associated with a first embodiment of the present invention is described by referring to FIGS. 1 and 2 which show the configuration of the sample milling apparatus, 100, associated with the first embodiment. In FIGS. 1 and 2, X-, Y-, and Z-axes are shown as three mutually perpendicular axes.

The sample milling apparatus 100 is an ion beam milling apparatus which emits an ion beam at a sample S, mills it, and prepares a specimen used for observation or analysis. The sample milling apparatus 100 is the Cross Section Polisher (a trademark registered) for milling a cross section through a sample, for example.

The sample milling apparatus 100 is used for preparation of specimens for electron microscopes such as scanning electron microscopes (SEMs), transmission electron microscopes (TEMs), scanning transmission electron microscopes (STEMs), and so on. Furthermore, the sample milling apparatus 100 is used for preparation of specimens for analysis equipment other than electron microscopes, for example, electron probe microanalyzers (EPMAs) and Auger microprobes.

Referring still to FIGS. 1 and 2, the sample milling apparatus 100 includes an ion source 10, a sample stage pull-out mechanism 20, a sample stage 30, a swing mechanism 40, a positioning camera 50, a milling observation camera 60, a chamber housing 70 defining a sample chamber 72 therein, and an image processor 80. FIG. 1 shows an operational state in which the sample stage pull-out mechanism 20 has been closed or compressed to push the sample stage 30 into the sample chamber 72. FIG. 2 shows an operational state in which the sample stage pull-out mechanism 20 has been opened or stretched to pull out the sample stage 30 from the sample chamber 72.

The ion source 10 produces and emits an ion beam at the sample S. The ion source 10 is mounted at the top of the chamber housing 70. The ion beam emitted from the ion source 10 is parallel to the Z-axis. The ion source 10 will be described in detail later.

The sample stage pull-out mechanism 20 is mounted to the chamber housing 70 so as to be opened and closed. The pull-out mechanism 20 constitutes a cover over the chamber housing 70. The sample stage 30 is mounted to the sample stage pull-out mechanism 20. The sample stage 30 can be pulled out from the sample chamber 72 as shown in FIG. 2 by opening or stretching the stage pull-out mechanism 20. Consequently, the interior of the chamber housing 70, i.e., the sample chamber 72, can be opened to the atmosphere. Also, by opening the sample stage pull-out mechanism 20, the positioning camera 50 is placed over the sample S and so the sample S can be observed with the positioning camera 50.

The sample stage 30 can be pushed into the sample chamber 72 by closing the sample stage pull-out mechanism 20 as shown in FIG. 1. In consequence, the chamber housing 70 can be made airtight. Under this condition, the sample chamber 72 can be evacuated or depressurized by operating vacuum pumping equipment (not shown). By closing the sample stage pull-out mechanism 20, the ion source 10 is placed over the sample S and the sample S can be milled with the ion beam emitted from the ion source 10.

The sample stage 30 is mounted to the swing mechanism 40 and operates to mechanically support the sample S to be milled. The sample stage 30 has an X drive mechanism 32 and a Y drive mechanism 34 which are capable of moving the sample S along the X-axis and Y-axis, respectively. The X drive mechanism 32 and Y drive mechanism 34 together permit the sample S to be moved horizontally in two dimensions. Hence, the sample S can be placed in position. The sample milling apparatus 100 is equipped with a beam shielding plate (not shown) for shielding the ion beam. The sample S is supported on the sample stage 30 and has portions protruding from the shielding plate. These protruding portions are sputtered.

The swing mechanism 40 is mounted to the sample stage pull-out mechanism 20. By opening the pull-out mechanism 20, the swing mechanism 40 is pulled out, and the sample stage 30 is also pulled out.

The swing mechanism 40 tilts the sample stage 30 around a swing axis A (tilt axis). The swing mechanism 40 swings the sample S by tilting the sample stage 30 around the swing axis A, for example, at regular cycles. In the illustrated example, the swing axis A is parallel to the Y-axis.

The positioning camera 50 is mounted at the upper end of the sample stage pull-out mechanism 20. For example, the positioning camera 50 is a camera attached to an optical microscope. That is, the image captured by the positioning camera 50 is an image observed with the optical microscope. The positioning camera 50 is used to bring a target milling position for the sample S into coincidence with the impact point of the ion beam. The image captured by the positioning camera 50 is sent to the image processor 80. For example, the sample can be milled at the target milling position with the ion beam emitted from the ion source 10 by bringing the target milling position into coincidence with the center of the image captured by the positioning camera 50.

When the sample stage pull-out mechanism 20 is in its open state, the positioning camera 50 is placed at a position where it can observe the sample S. In this open state, the optical axis of the positioning camera 50 is parallel to the Z-axis. When the sample stage pull-out mechanism 20 is in its closed state, the positioning camera 50 is placed outside the sample chamber 72 by a camera tilting mechanism 52.

The milling observation camera 60 is disposed outside the sample chamber 72 and can observe the sample S inside of the sample chamber 72 through an observation window 74 formed in the chamber housing 70. The observation camera 60 can observe a cross section of the sample S while it is being milled. The optical axis of the milling observation camera 60 is parallel to the Y-axis. The image captured by the observation camera 60 is sent to the image processor 80.

The sample stage 30 is disposed within the chamber housing 70. As mentioned previously, the sample chamber 72 is an interior space of the chamber housing 70. In the sample chamber 72, the sample S is irradiated with an ion beam.

The image processor 80 performs processing such that the image captured by the positioning camera 50 is displayed in the display section. Furthermore, the image processor 80 performs processing such that the image captured by the milling observation camera 60 is displayed in the display section.

Figure 3:
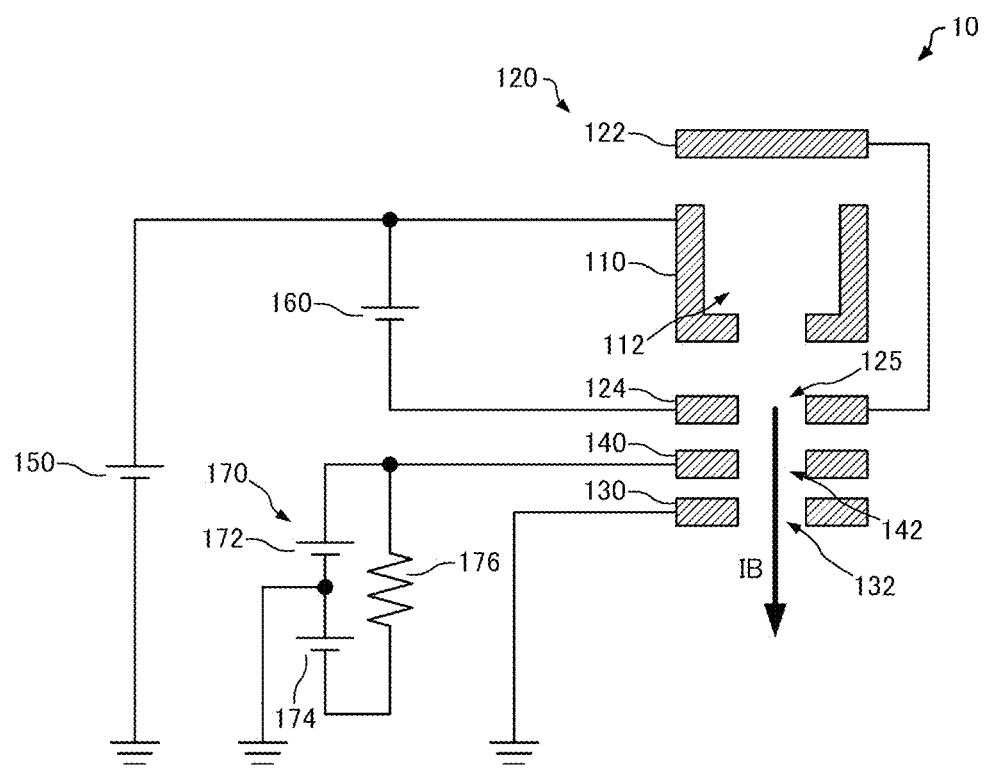
FIG. 3 is a diagram illustrating the configuration of an ion source.

FIG. 3 shows the configuration of the ion source 10. The ion source 10 is of the Penning type and includes an anode 110, a cathode 120, an extraction electrode 130, a focusing electrode 140, an anode power supply 150, a cathode power supply 160, and a focusing electrode power supply 170.

The anode 110 is cylindrical and defines an interior space which serves as an ionization chamber 112 for generating ions. A gas (such as argon gas) is admitted into the ionization chamber 112 from a gas source (not shown).

The cathode 120 constitutes polepieces for generating a magnetic field in the ionization chamber 112 and operates to emit electrons which are swirled by the magnetic field produced by the polepieces. The cathode 120 includes a first electrode 122 and a second electrode 124 which are placed opposite to each other. The ionization chamber 112 is formed between the first electrode 122 and the second electrode 124. The second electrode 124 is provided with a hole 125 for passage of ions generated in the ionization chamber 112.

The extraction electrode 130 extracts the ions generated in the ionization chamber 112 and produces an electric field that accelerates the ions so that the ions are released as an ion beam IB from the ion source 10. The extraction electrode 130 is disposed behind the second electrode 124 (behind the focusing electrode 140 in the illustrated example) and provided with a hole 132 for passage of the ions generated in the ionization chamber 112.

The focusing electrode 140 is positioned between the cathode 120 (second electrode 124) and the extraction electrode 130 and controls the spatial profile of the ion beam IB which represents the intensity distribution of the ion beam IB in the space. The focusing electrode 140 is provided with a hole 142 for passage of the ions generated in the ionization chamber 112.

The anode power supply 150 is used to apply an acceleration voltage between the anode 110 and the extraction electrode 130 in order to accelerate ions. The positive terminal of the anode power supply 150 is electrically connected with the anode 110, while the negative terminal of the anode power supply 150 is electrically connected to ground.

The cathode power supply 160 is operative to apply a discharge voltage for inducing an electric discharge between the anode 110 and the cathode 120. The negative terminal of the cathode power supply 160 is electrically connected with the cathode 120, while the positive terminal of the cathode power supply 160 is electrically connected with the positive terminal of the anode power supply 150. That is, the cathode power supply 160 is a floating power supply whose positive output is connected to the anode power supply 150, establishing a potential difference between the anode 110 and the cathode 120.

The extraction electrode 130 is electrically connected to ground. The focusing electrode power supply 170 applies a focusing voltage to the focusing electrode 140 to control the spatial profile of the ion beam IB. Because ions collide with the focusing electrode 140, electric charge would normally accumulate on it. To prevent this, the focusing electrode power supply 170 can function as a current sink and, therefore, the focusing electrode 140 can maintain a preset voltage.

In the illustrated example, the focusing electrode power supply 170 includes voltage sources 172, 174, and a resistor 176. The voltage source 172 has a positive terminal electrically connected with the focusing electrode 140 and a negative terminal electrically connected to ground. The voltage source 174 has a positive terminal electrically connected to ground and a negative terminal electrically connected with the focusing electrode 140 via the resistor 176. Therefore, the voltage source 172 applies a focusing voltage to the focusing electrode 140 and can dissipate electric charge, which is accumulated on the focusing electrode 140, to ground via the resistor 176.

Note that the focusing electrode power supply 170 does not need to function as a current sink, in which case the positive terminal of the focusing electrode power supply 170 is electrically connected with the focusing electrode 140 and the negative terminal of the focusing electrode power supply 170 is electrically connected to ground.

1.2. Operation

1.2.1. Emission of Ion Beam

In the ion source 10, the discharge voltage applied between the anode 110 and the cathode 120 causes emission of electrons from the cathode 120. The emitted electrons accelerate toward the anode 110 and are swirled by the magnetic field produced by the polepieces of the cathode 120. When the molecules of the gas introduced in the ionization chamber 112 collide with the electrons swirling in the chamber 112, the gas molecules become ionized, producing positive ions in the ionization chamber 112.

The positive ions generated in the ionization chamber 112 are pulled out of the ionization chamber 112 by the acceleration voltage applied between the anode 110 and the extraction electrode 130 and become accelerated. The positive ions generated in the ionization chamber 112 are released from the ion source 10 through the hole 125, 142, and 132 which are formed in the cathode 120, focusing electrode 140, and extraction electrode 130, respectively. In this way, the ion beam IB is emitted from the ion source 10.

1.2.2. Operation of Focusing Electrode

In the sample milling apparatus 100, the spatial profile of the ion beam IB is directly related to the milled cross-sectional profile of the sample S and to the milling rate. In the sample milling apparatus 100, the sample S and a shielding plate are placed at a position where the axis of the ion beam IB and the swing axis A intersect at right angles and the cross section is milled and so the spatial profile of the ion beam IB unambiguously represents the cross-sectional profile of the milled sample S.

In particular, in the sample milling apparatus 100, the cross-sectional profile of the sample S milled with the ion beam IB reflects the cross-sectional profile of the ion beam IB which in turn is an intensity distribution of the ion beam IB across its cross section. In the sample milling apparatus 100, the cross-sectional profile of the ion beam IB can be controlled by varying the focusing voltage applied to the focusing electrode 140.

Figure 4:
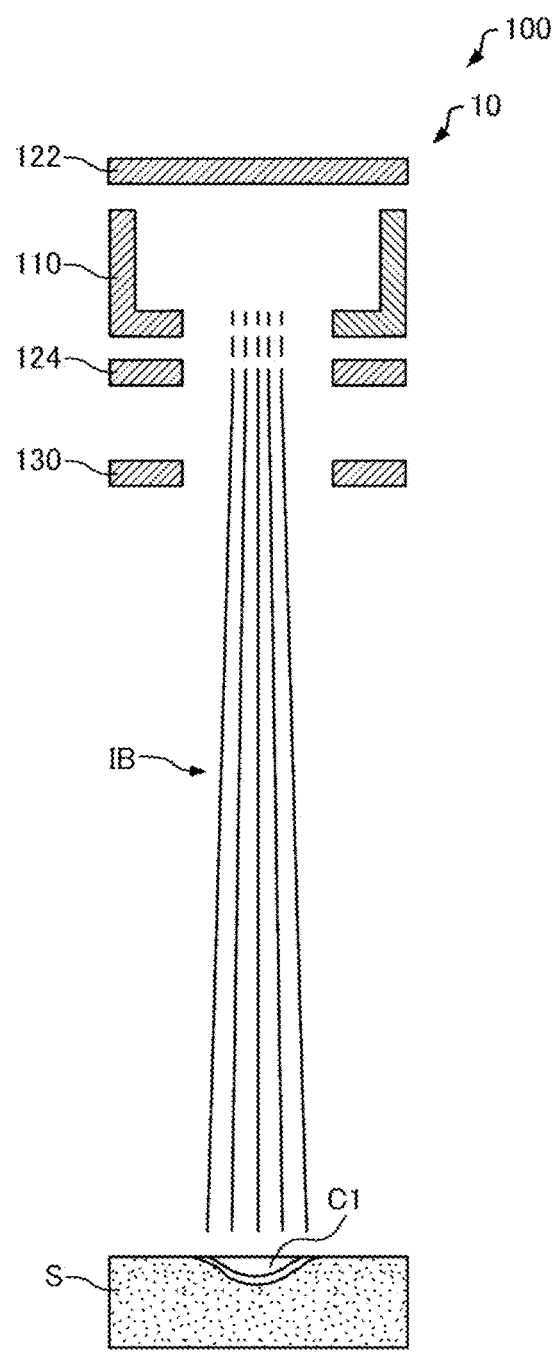
FIGS. 4-9 are diagrams illustrating the operation of a focusing electrode.

FIGS. 4-9 illustrate the operation of the focusing electrode 140. FIG. 4 illustrates the manner in which the sample S is being milled with a conventional sample milling apparatus. In this conventional apparatus, the ion source 10 does not have the focusing electrode 140 as shown in FIG. 4. FIGS. 5-9 illustrate the manner in which the sample S is being milled with the sample milling apparatus 100, and depict a case where the focusing voltage applied to the focusing electrode 140 is varied while the acceleration voltage, the discharge voltage, and the flow rate of gas admitted into the ionization chamber 112 are kept constant.

In the sample milling apparatus 100 shown in FIG. 4, an acceleration voltage is set. Adjustments are made of a discharge voltage at which the ion beam IB can be emitted stably under the set acceleration voltage and of the flow rate of gas admitted into the ionization chamber 112. Thus, illumination conditions are determined. The sample S is illuminated with the ion beam IB.

Figure 5:
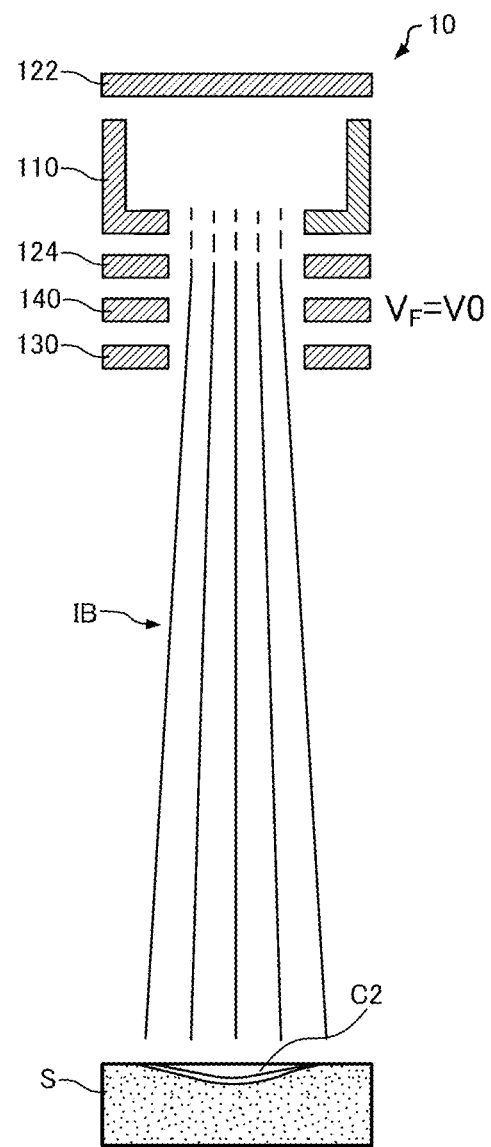

Under the illumination conditions illustrated in FIG. 4, the focusing voltage $V_F$ is set to an initial value V0 ($V_F$=V0), and the discharge voltage applied between the anode 110 and the cathode 120 is increased. This increases the diameter of the ion beam IB as shown in FIG. 5, resulting in an increase of the output current of the ion beam IB. As a result, the milled cross section C2 shown in FIG. 5 becomes greater in width than the milled cross section C1 shown in FIG. 4.

Figure 6:
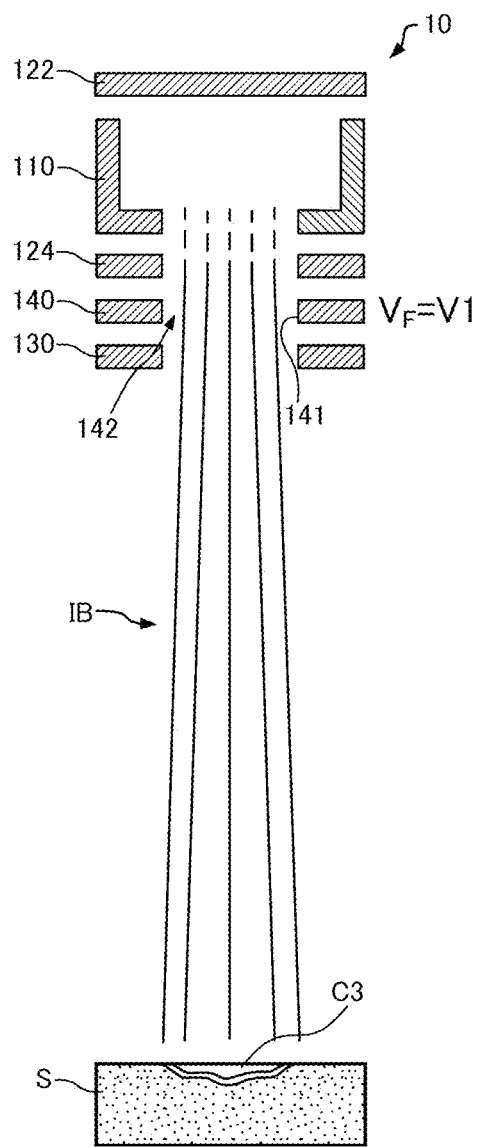

Under the illumination conditions illustrated in FIG. 5, the focusing voltage $V_F$ is increased to V1 (V1>V0) and applied. Consequently, as shown in FIG. 6, ions in orbits close to the inner surface 141 defining the hole 142 of the focusing electrode 140 (i.e., ions passing close to the outer periphery of the ion beam IB) are affected greatly by the electric field produced by the focusing electrode 140. Therefore, the ions passing close to the outer periphery of the ion beam IB are attracted toward the center of the ion beam IB. Hence, the ion beam IB possesses a cross-sectional profile having three peaks. As a result, as shown in FIG. 6, there is obtained a milled cross section C3 having three recesses corresponding to the three peaks of the cross-sectional profile.

Under the illumination conditions of FIG. 6, the focusing voltage $V_F$ is increased to V2 (V2>V1) and applied. Consequently, the ions passing near the outer periphery of the ion beam IB are attracted closer to the center of the ion beam IB than in the example of FIG. 6. In the cross-sectional profile of the ion beam IB, therefore, the three peaks overlap into a rectangular form. That is, a beam of uniform intensity is obtained. As a result, as shown in FIG. 7, a milled cross section C4 of a rectangular form is obtained.

Figure 7:
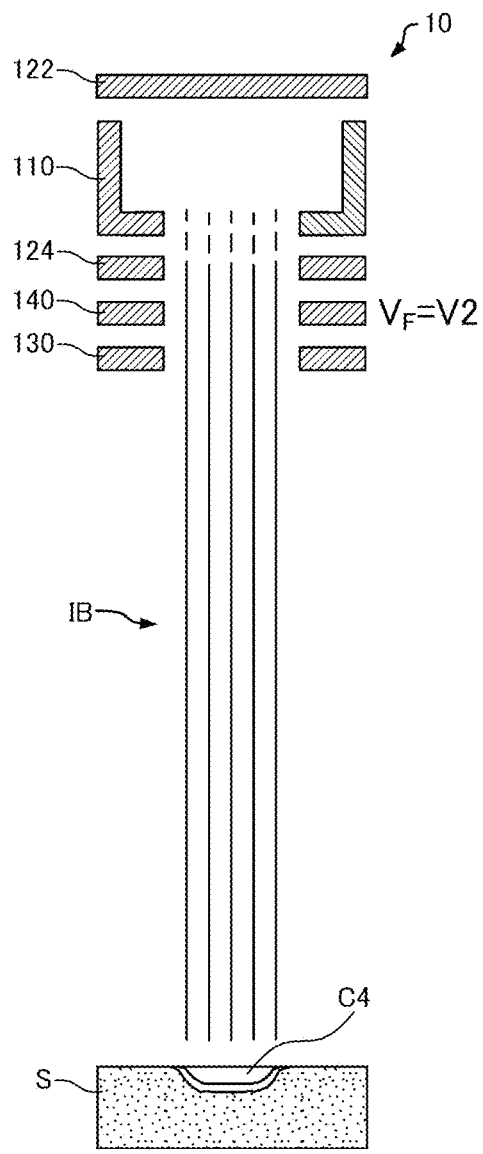

Under the illumination conditions of FIG. 7, the focusing voltage $V_F$ is increased to V3 (V3>V2) and applied, so that the three peaks of the cross-sectional profile are concentrated at the center of the beam. As a result, as shown in FIG. 8, a semicircular milled cross section C5 is obtained.

Figure 8:
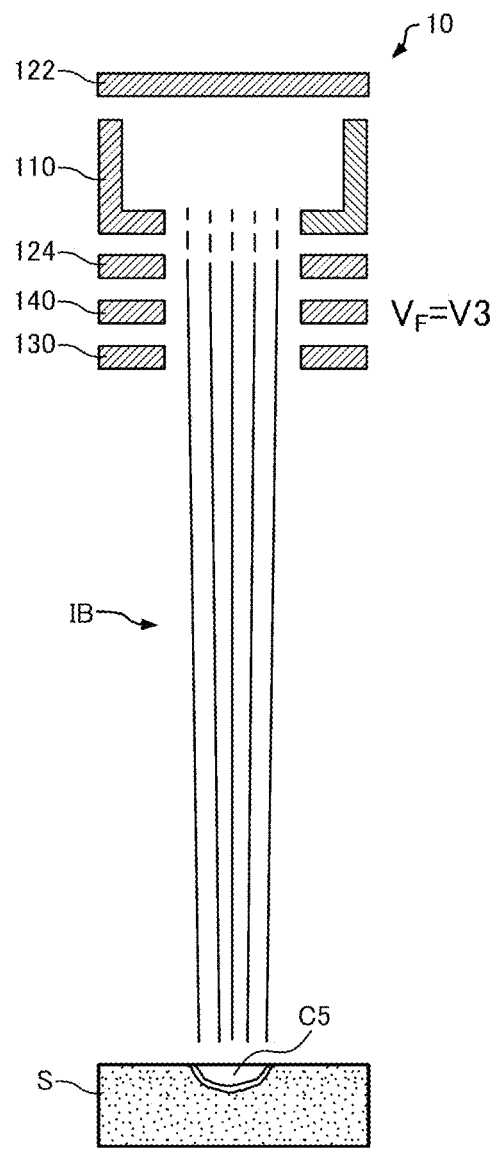
Figure 9:
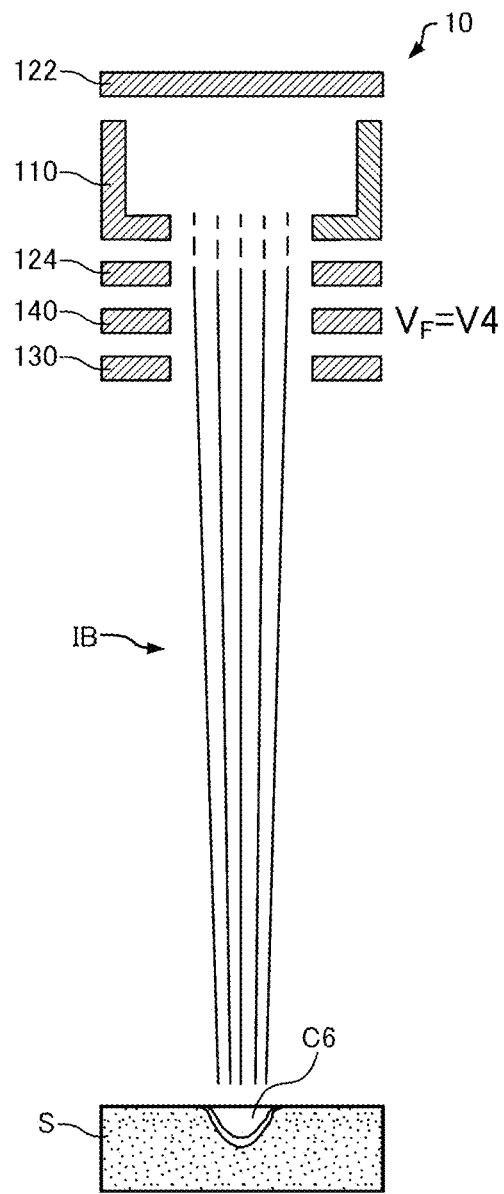
Figure 10:
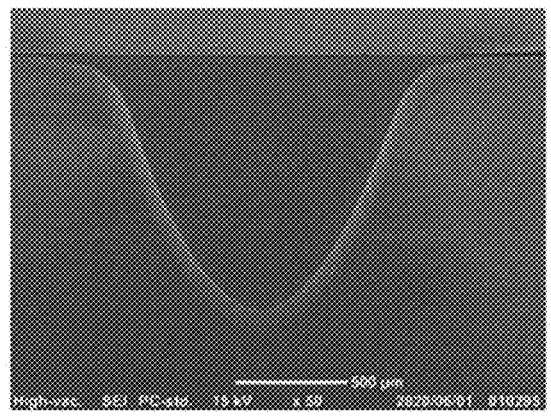
FIGS. 10-15 are scanning electron microscope images of a cross section of a sample being milled.
Figure 11:
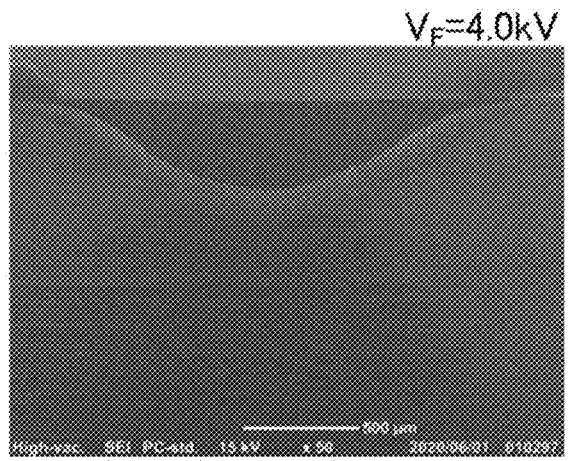

Under the illumination conditions of FIG. 8, the focusing voltage $V_F$ is increased to V4 (V4>V3) and applied. Consequently, as shown in FIG. 9, the diameter of the ion beam IB is minimized and the current density of the beam is maximized. This results in a milled cross section C6 of minimum width.

FIGS. 10-15 are scanning electron microscope (SEM) images of milled cross sections of samples. These SEM photographs were taken of the cross sections of the samples which were milled while varying the focusing voltage but maintaining the acceleration voltage and the discharge voltage constant.

In particular, the acceleration voltage was set to 8.0 kV, and the discharge voltage was set to 0.9 kV. The SEM photograph shown in FIG. 10 was taken of a cross section of a sample milled with the ion beam IB (see FIG. 4) produced from the ion source not having the focusing electrode 140. The SEM photograph shown in FIG. 11 was taken of a cross section of a sample milled at a focusing voltage $V_F$=4.0 kV. The SEM photograph shown in FIG. 12 was taken of a cross section of a sample milled at a focusing voltage $V_F$=5.6 kV. The SEM photograph shown in FIG. 13 was taken of a cross section of a sample milled at a focusing voltage $V_F$=6.2 kV. The SEM photograph shown in FIG. 14 was taken of a cross section of a sample milled at a focusing voltage $V_F$=6.4 kV. The SEM photograph shown in FIG. 15 was taken of a cross section of a sample milled at a focusing voltage $V_F$=6.6 kV.

In this way, the spatial profile of the ion beam IB can be controlled by controlling the focusing voltage applied to the focusing electrode 140. As a result, the milled cross section of the sample S can be milled into various shapes without modifying any of the acceleration voltage, discharge voltage, gas flow rate, and so on.

1.3. Milling Method

In the sample milling apparatus 100, the spatial profile of the ion beam IB can be controlled by varying the focusing voltage applied to the focusing electrode 140 as described above. A sample milling method for use in the sample milling apparatus 100 includes the step of controlling the spatial profile of the ion beam IB by varying the focusing voltage applied to the focusing electrode 140.

(1) Milling Using Ion Beam Whose Diameter is Reduced Using Focusing Electrode

Figure 15:
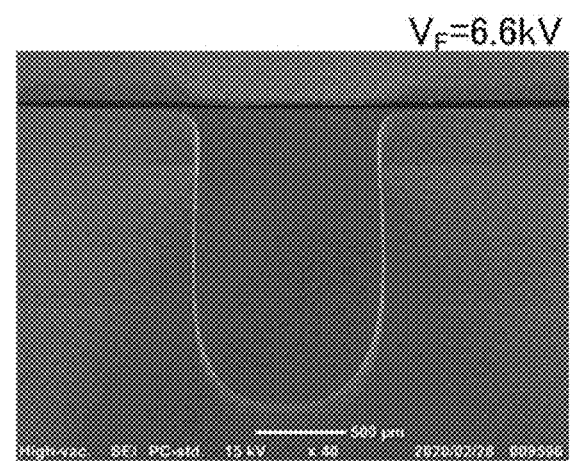

As shown in FIGS. 9 and 15, the diameter of the ion beam IB can be reduced by the use of the focusing electrode 140. Under this condition, the current density of the ion beam IB is high and so the ion milling rate can be set high. Therefore, where the target material is long in the depthwise direction and narrow in width or where the target material is small, the milling can be performed efficiently.

Figure 16:
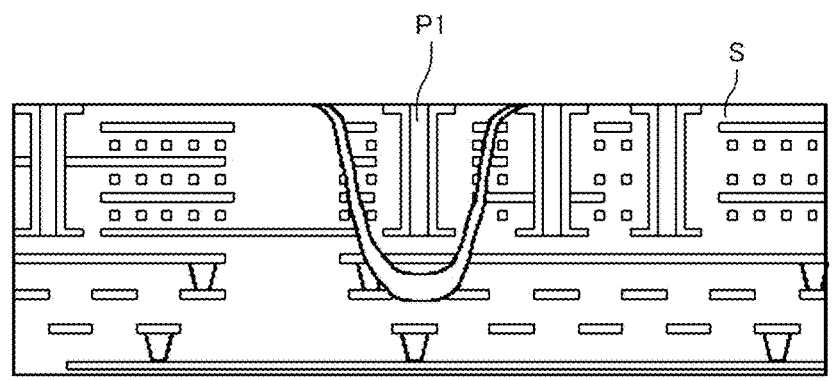
FIG. 16 is a schematic view of a cross section of a sample milled by the novel sample milling apparatus of FIGS. 1-2.
Figure 17:
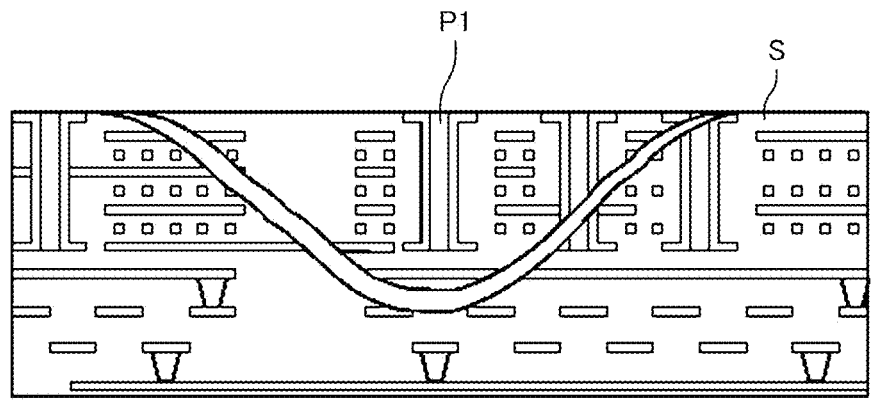
FIG. 17 is a schematic view of a cross section of a sample milled by a conventional sample milling apparatus.

FIG. 16 schematically shows a cross section of the sample S milled with the sample milling apparatus 100. FIG. 17 schematically shows a cross section of the sample S milled with the conventional sample milling apparatus of FIG. 4. The same sample S was milled for both FIGS. 16 and 17.

In the sample milling apparatus 100, the diameter of the ion beam IB can be reduced using the focusing electrode 140 as shown in FIG. 16. Consequently, a target material P1 that is long in the depthwise direction and narrow in width can be milled in a shorter time than where the conventional sample milling apparatus of FIG. 17 is used.

Figure 18:
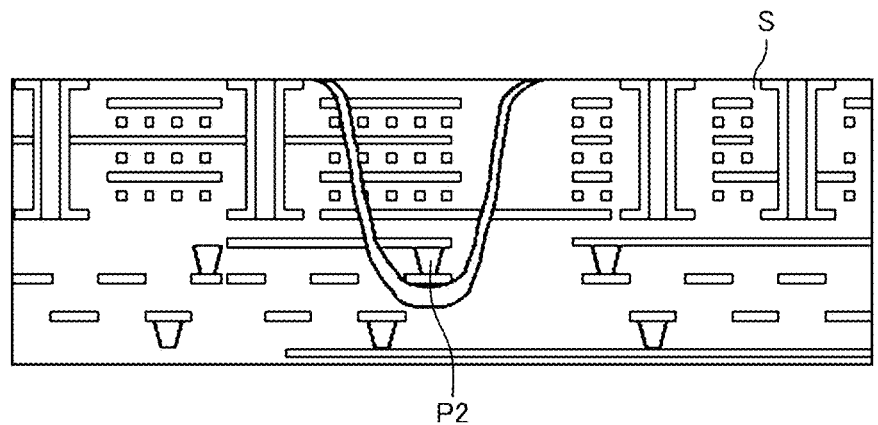
FIG. 18 is a schematic view of a cross section of a sample milled by the novel sample milling apparatus of FIGS. 1-2.
Figure 19:
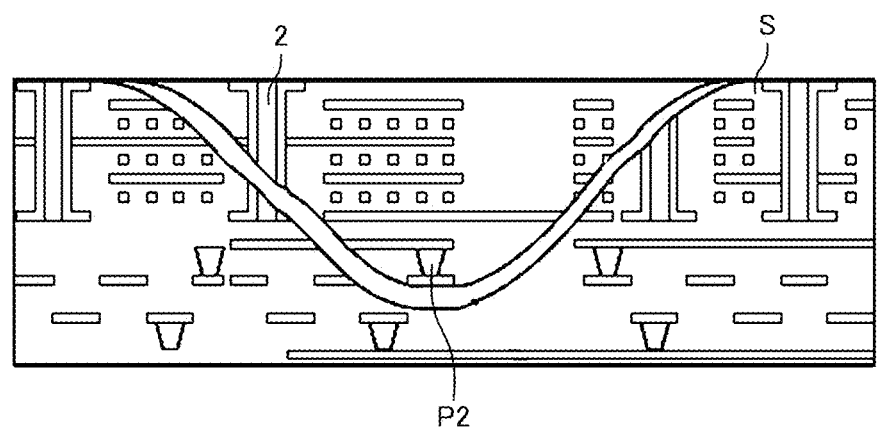
FIG. 19 is a schematic view of a cross section of a sample milled by the conventional sampling milling apparatus.

FIG. 18 schematically shows a cross section of the sample S milled with the sample milling apparatus 100. FIG. 19 schematically shows a cross section of the sample S milled with the conventional sample milling apparatus of FIG. 4. The same sample S was milled for both FIGS. 18 and 19.

With the sample milling apparatus 100, the diameter of the ion beam IB can be reduced by the use of the focusing electrode 140 as shown in FIG. 18. Consequently, a cross section of a small target material P2 can be milled in a shorter time than where the conventional sample milling apparatus of FIG. 19 is used. Furthermore, as shown in FIG. 18, the milling width can be reduced by reducing the diameter of the ion beam IB by the use of the focusing electrode 140. For this reason, a structure 2 made of a different material and present around the target material P2 is not milled; otherwise, sputtered particles would adhere to the target material P2.

(2) Milling Using Ion Beam Whose Diameter is Increased Using Focusing Electrode

Figure 12:
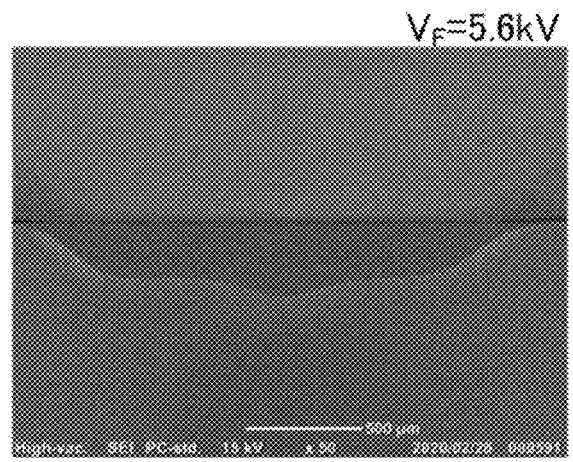

As shown in FIGS. 6 and 12, the use of the focusing electrode 140 makes it possible to increase the diameter of the ion beam IB.

Figure 20:
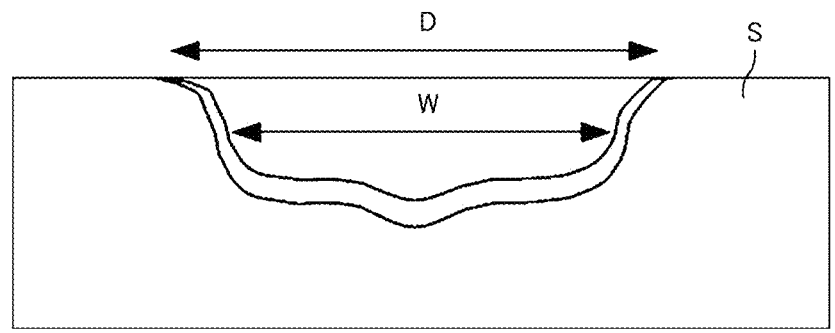
FIG. 20 is a schematic view of a cross section of a sample milled by the novel sample milling apparatus of FIGS. 1-2.
Figure 21:
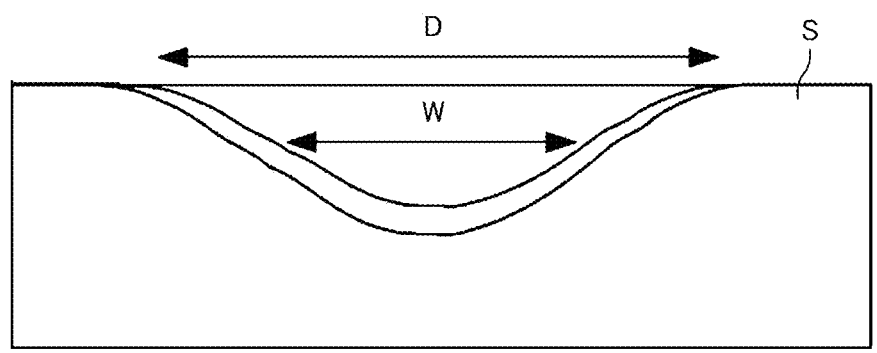
FIG. 21 is a schematic view of a cross section of a sample milled by the conventional sampling milling apparatus.

FIG. 20 schematically shows a cross section of the sample S milled with the sample milling apparatus 100. FIG. 21 schematically shows a cross section of the sample S milled with the conventional sample milling apparatus of FIG. 4.

In the sample milling apparatus 100 of FIG. 20, the diameter of the ion beam IB is increased by the use of the focusing electrode 140. On the other hand, in the conventional sample milling apparatus of FIG. 21, the diameter of the ion beam IB is increased by adjusting the acceleration voltage, discharged voltage, and gas flow rate.

As shown in FIG. 21, if the diameter of the ion beam IB is increased by adjusting the acceleration voltage, discharge voltage, and gas flow rate, then the intensity at the beam center is still high. The intensity decreases toward the outside periphery of the beam. Accordingly, the milling width W at one-half depth of the milled cross section is roughly one half of the diameter D of the ion beam IB.

On the other hand, where the diameter is increased by the use of the focusing electrode 140 as shown in FIG. 20, the milling width W at one-half depth of the milled cross section can be made comparable to the diameter D of the ion beam IB.

Figure 22:
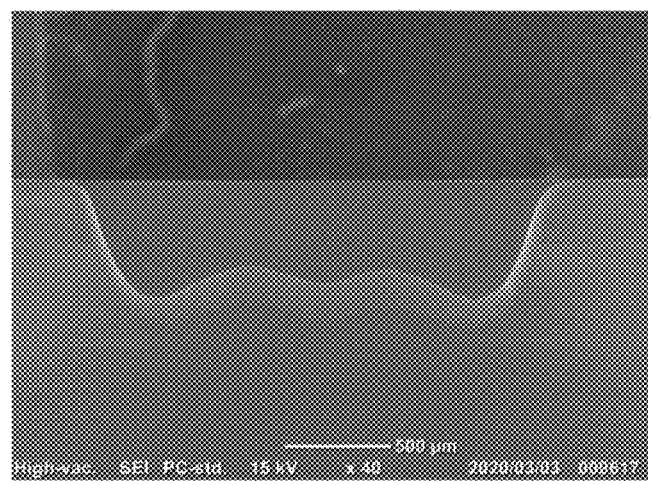
FIG. 22 is an SEM image of a cross section of a sample milled by the novel sample milling apparatus of FIGS. 1-2.

FIG. 22 is an SEM photograph of a cross section of the sample S milled with the sample milling apparatus 100, the cross section having a depth of 500 μm. As shown, the use of the focusing electrode 140 makes it possible to set the milling width at one-half depth (250 μm) of the cross section to 2 mm or more.

(3) Milling Using a Combination of Ion Beam Whose Diameter is Increased Using Focusing Electrode and Ion Beam Whose Diameter is Reduced Using Focusing Electrode In the sample milling apparatus 100, the focusing voltage $V_F$ is set to a first voltage and the sample S is irradiated with the ion beam IB to mill the sample S. Then, the focusing voltage $V_F$ is set to a second voltage different from the first voltage and the sample S is irradiated with the ion beam IB to mill the sample S.

Figure 23:
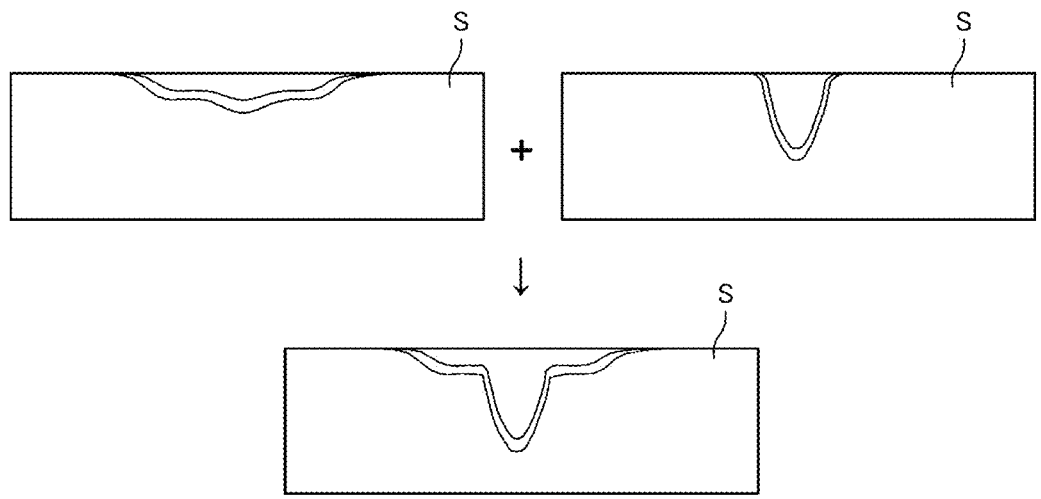
FIG. 23 schematically shows cross sections of a sample formed by a combination of a milling operation using an ion beam whose diameter is increased using the focusing electrode and a milling operation using an ion beam whose diameter is reduced using the focusing electrode.

FIG. 23 schematically shows a cross section of the sample S milled using a combination of a milling operation using the ion beam IB whose diameter is increased by the use of the focusing electrode 140 and a milling operation using the ion beam IB whose diameter is reduced by the use of the focusing electrode 140.

As shown in FIG. 23, the focusing voltage $V_F$ is increased to V1, and the sample S is milled with the ion beam IB having the increased diameter (see FIG. 6). Then, the focusing voltage $V_F$ is reduced to V4, and the sample S is milled with the ion beam IB having the reduced diameter (see FIG. 9). Consequently, a wide area close to the sample surface and a deep sample area which are around a cross section can be milled efficiently. By switching the focusing voltage during milling in this way, the milling width can be varied greatly in the depthwise direction of the sample S.

Figure 13:
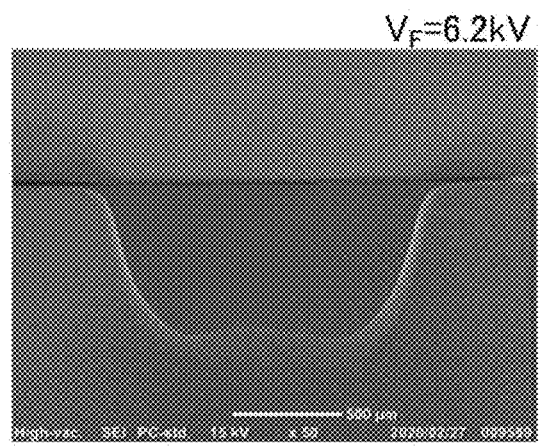
Figure 14:
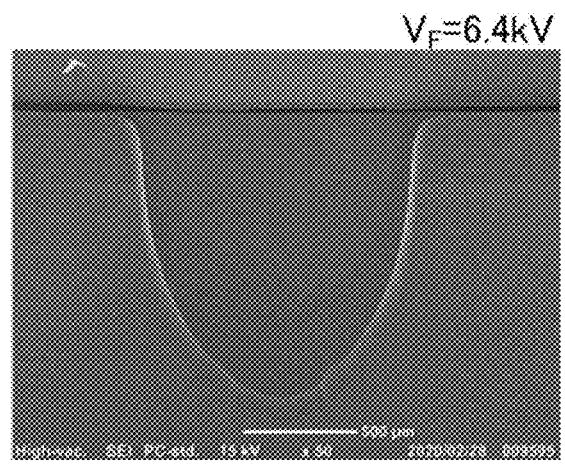

(4) Milling Using Ion Beam Whose Intensity is Homogenized Using Focusing Electrode By using the focusing electrode 140, the ion beam IB having a uniform intensity can be obtained. That is, the ion beam IB has a rectangular cross-sectional profile as shown in FIGS. 7 and 13.

Figure 24:
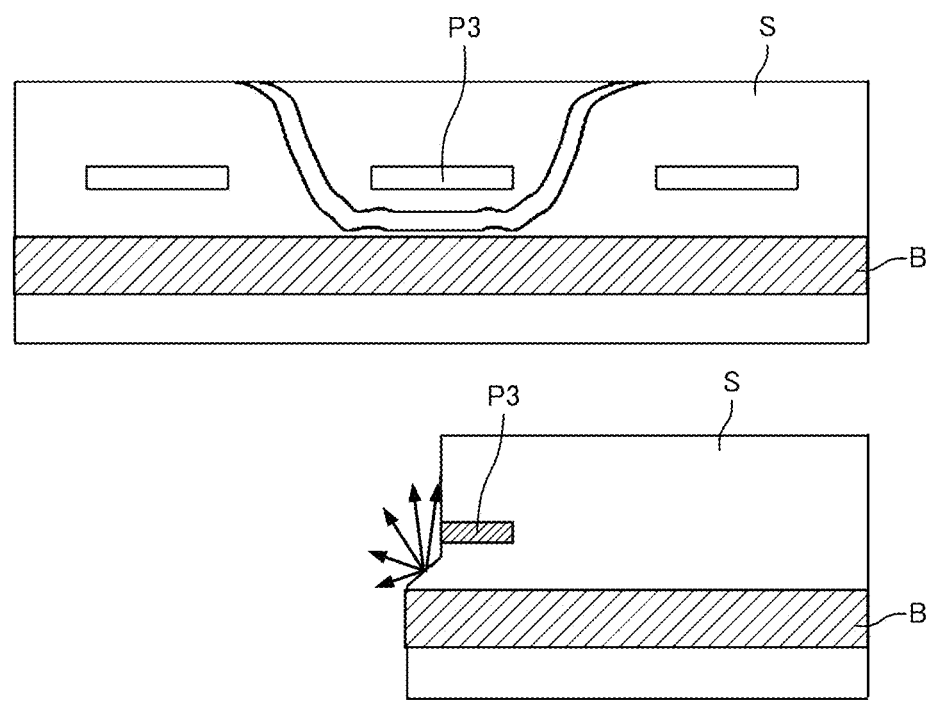
FIG. 24 schematically shows a cross section of a sample milled by the novel sample milling apparatus of FIGS. 1-2.
Figure 25:
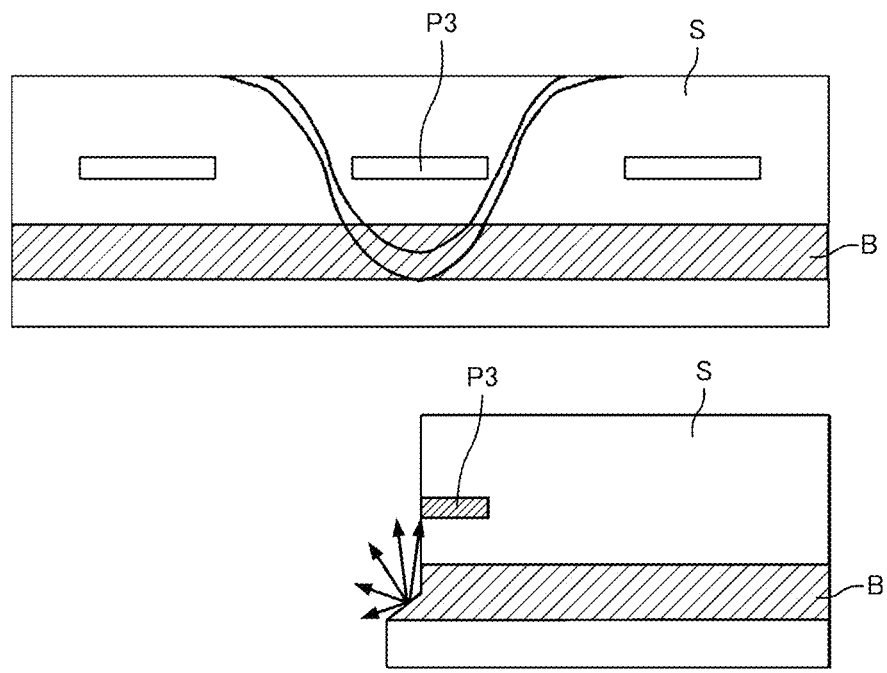
FIG. 25 schematically shows a cross section of a sample milled by the conventional sampling milling apparatus.

FIG. 24 schematically shows a cross section of the sample S milled with the sample milling apparatus 100. FIG. 25 schematically shows a cross section of the sample S milled with the conventional sample milling apparatus of FIG. 4.

Where the sample S is milled with the conventional sample milling apparatus of FIG. 25, a cross section of a target material P3 may not be milled unless milled to about twice the depth of the target material P3. If the milling position reaches a deep area in order to mill the target material P3 in this way, even a metal layer B lying deeper than the target material P3 will be milled. If the metal layer made of a dissimilar material is milled, sputtered particles may adhere to the target material P3. In order to prevent the adhesion of sputtered particles to the target material P3, it is necessary to mill the sample deeper than the metal layer B.

On the other hand, in the sample milling apparatus 100, the intensity of the ion beam IB can be homogenized using the focusing electrode 140 as shown in FIG. 24. Variations in milling width in the depthwise direction can be reduced by the use of the ion beam IB having homogenized intensity. Therefore, a cross section of the target material P3 can be milled if milled either to the same depth as the target material P3 or slightly deeper. Consequently, if a layer of a dissimilar material such as the metal layer B exists at a position deeper than the target material P3 as shown in FIG. 24, adhesion of sputtered particles to the target material P3 can be prevented.

Figure 26:
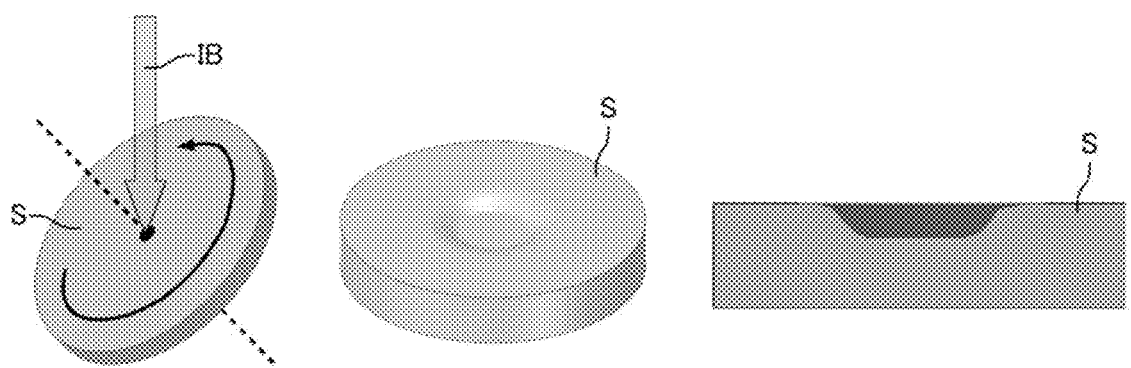
FIG. 26 schematically illustrates the manner in which a sample is milled and planarized with the novel sample milling apparatus of FIGS. 1-2.

FIG. 26 schematically illustrates the manner in which the sample S is milled into a flat plane with the sample milling apparatus 100. FIG. 27(A-C) schematically illustrates the manner in which the sample S is milled into a flat plane with the conventional sample milling apparatus of FIG. 4.

Figure 27A:
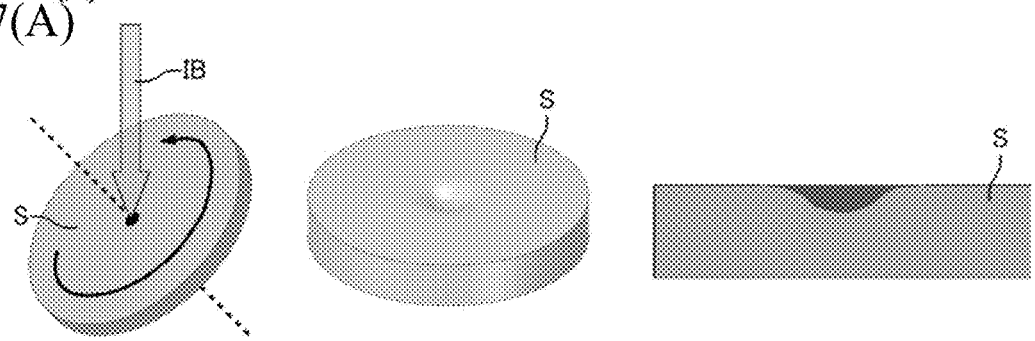
FIGS. 27(A-C) schematically illustrates the manner in which a sample is milled and planarized with the conventional sample milling apparatus.

A surface of the sample S can be milled by directing the ion beam IB at the sample S tilted relative to the ion beam IB while rotating the sample S. At this time, if the center of the ion beam IB is brought into coincidence with the center of rotation of the sample S as shown in FIG. 27(A), the flattened area of the milled surface of the sample S narrows.

Figure 27B:
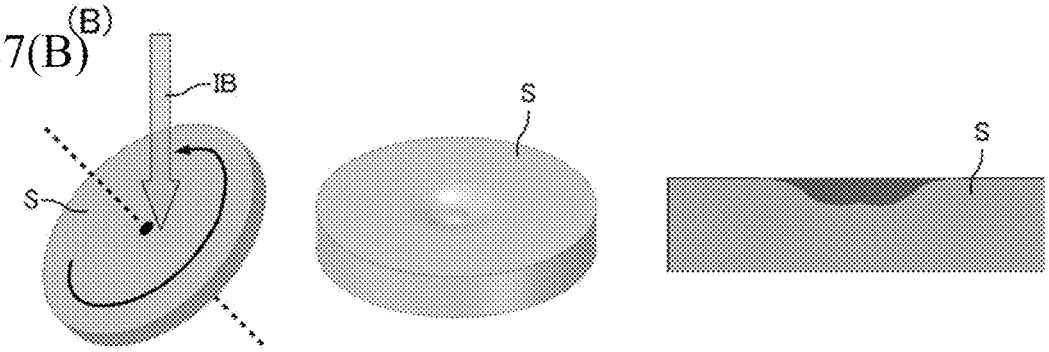
Figure 27C:
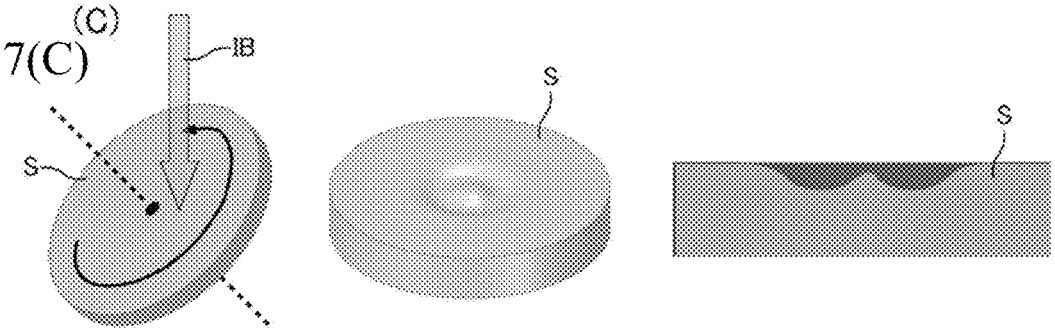

Therefore, if the center of rotation of the sample S is deviated from the center of the ion beam IB, a relatively flat area can be enlarged as shown in FIG. 27(B). However, if the distance between these two centers increases, then the flat area cannot be enlarged as shown in FIG. 27(C). In consequence, it is necessary that the distance between the center of rotation of the sample S and the center of the ion beam IB be adjusted to an appropriate value.

On the other hand, in the sample milling apparatus 100, the intensity of the ion beam IB can be homogenized using the focusing electrode 140 as shown in FIG. 26. A flat area can be easily enlarged by milling the sample S into a flat plane through the use of the ion beam IB whose intensity has been homogenized and bringing the center of the ion beam IB into coincidence with the center of rotation of the sample S.

(5) Milling Using a Low-Acceleration Ion Beam

The sample milling apparatus 100 has the focusing electrode 140 that is close in electric potential to the anode 110 and, therefore, if the potential of the anode 110 is lowered (i.e., the acceleration voltage is lowered) while maintaining the discharge voltage necessary for plasma generation, electrons necessary for the plasma generation can be confined within the ionization chamber 112. Furthermore, the extraction voltage for pulling out ions can be sustained because of the potential difference between the focusing electrode 140 and the extraction electrode 130. Consequently, the ion beam IB capable of milling the sample S can be released from the ion source 10 even at low acceleration voltages.

Figure 28:
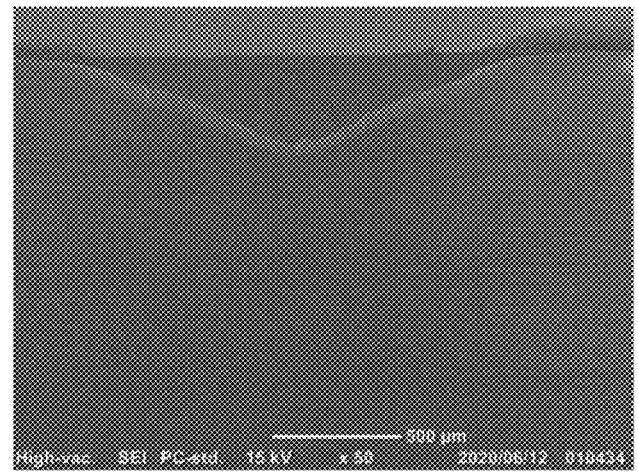
FIG. 28 is an SEM image of a sample which has been milled with an acceleration voltage of 2 kV.
Figure 29:
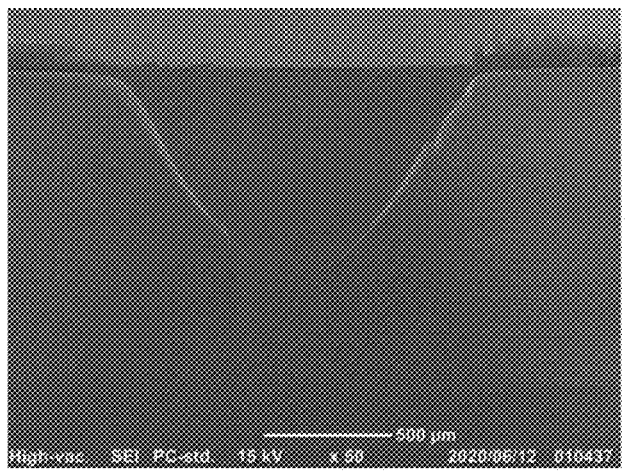
FIG. 29 is an SEM image of a sample which has been milled with an acceleration voltage of 3 kV.

FIG. 28 is an SEM photograph of a sample milled at an acceleration voltage of 2 kV using the sample milling apparatus 100. FIG. 29 is an SEM photograph of a sample milled at an acceleration voltage of 3 kV using the sample milling apparatus 100.

As shown in FIGS. 28 and 29, the sample milling apparatus 100 has the focusing electrode 140 and thus can mill a cross section of the sample S even at acceleration voltages of 2 to 3 kV (ion energies of 2 to 3 keV). In this way, the sample milling apparatus 100 can mill the sample S at low-acceleration voltages and hence can mill samples which are normally difficult to mill because they are susceptible to ion damage and thermal damage.

(6) Finishing Milling

Figure 30:
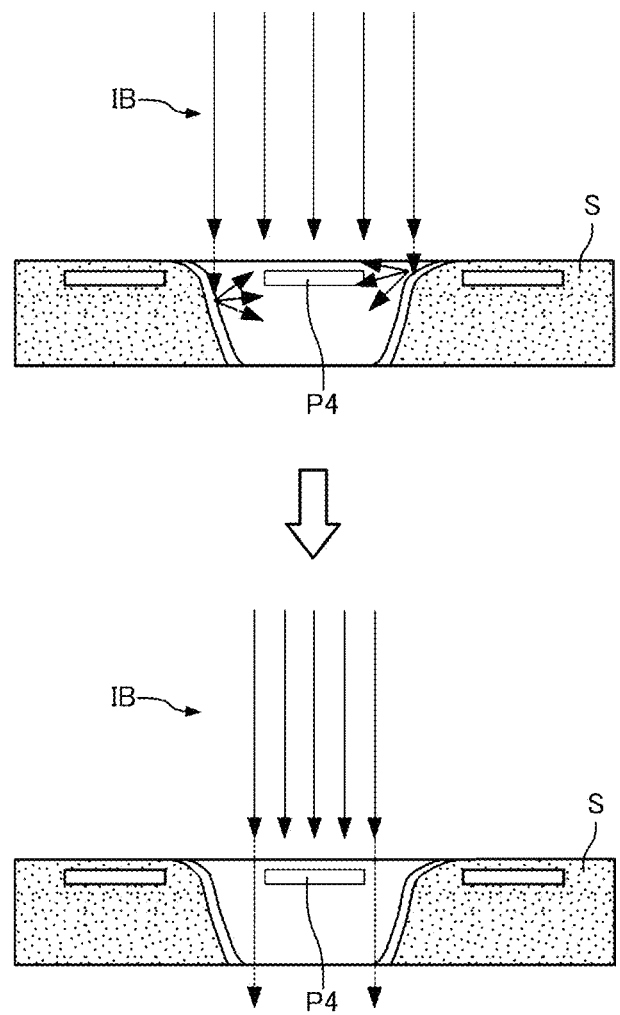
FIG. 30 illustrates one example of a finishing milling operation using the novel sample milling apparatus of FIGS. 1-2.
Figure 31:
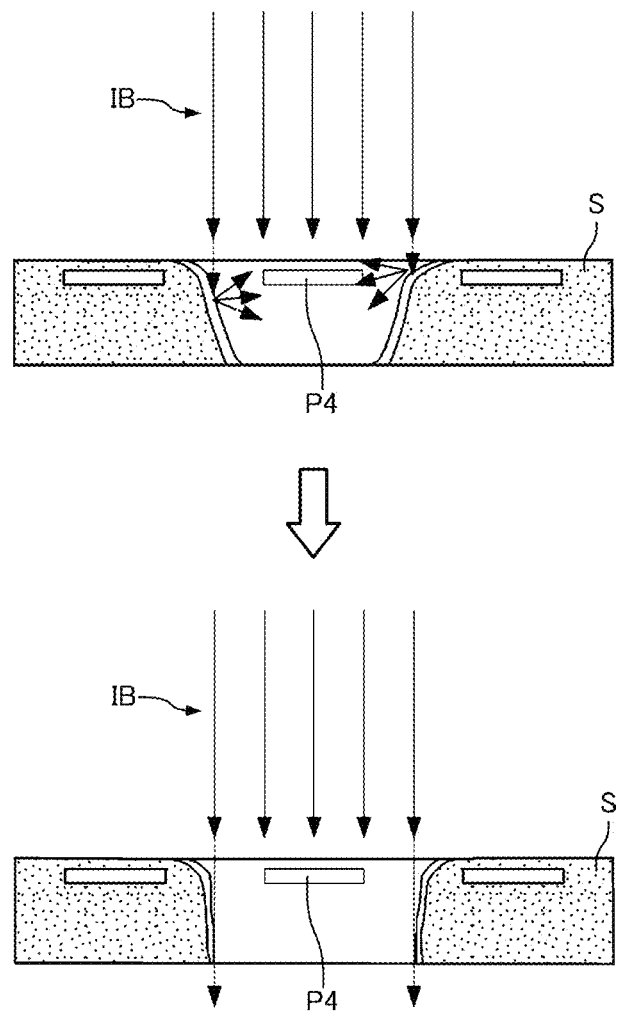
FIG. 31 illustrates one example of a finishing milling operation using the conventional sample milling apparatus.

FIG. 30 illustrates one example of a finishing milling operation using the sample milling apparatus 100. FIG. 31 illustrates one example of a finishing milling operation using the conventional sample milling apparatus of FIG. 4.

Where the target material P4 is close to the surface of the sample S or where a cross section of a sample having high sputter rate is milled, particles sputtered off from the sample S will readhere to the milled cross section.

As shown in FIG. 31, particles sputtered off from the boundary between the milled cross section and the unmilled area give the main cause of the readhesion. Therefore, it is possible to obtain a milled cross section while reducing the effects of readhesion by performing a milling operation for a long time until particles sputtered off from the boundary are no longer emitted and until sputtered particles readhering to the milled cross section cease to exist. However, this technique suffers from the problem that the milling is time consuming.

On the other hand, in the sample milling apparatus 100, when the milled cross section has just penetrated the sample S in the thicknesswise direction as shown in FIG. 30, the diameter of the ion beam IB can be reduced by the use of the focusing electrode 140. Consequently, a milled cross section can be fabricated in a short time efficiently while reducing the effects of readhesion because the ion beam IB does not hit the boundary between the milled cross section and the unmilled area.

(7) Milling Using a Combination of Different Swinging Motions

As shown in FIGS. 9 and 15, the diameter of the ion beam IB can be reduced by the use of the focusing electrode 140. Under this condition, the current density of the ion beam IB is high and so the milling rate can be made high. Therefore, the aspect ratio (i.e., the ratio of the milling depth to the milling width) of the milled cross section can be increased.

The profile of the milled cross section can be controlled by controlling the angle of swing when the sample S is swung. The sample milling apparatus 100 can mill various samples efficiently by controlling the spatial profile of the ion beam IB and the angle of swing based on the target area to be milled.

Figure 32:
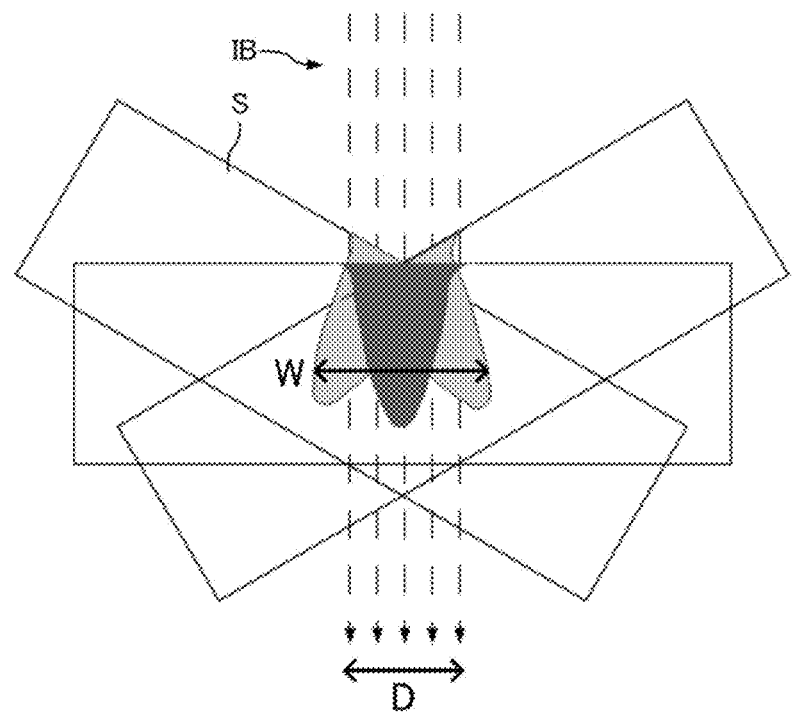
FIG. 32 illustrates a technique for milling a sample that is swung in the novel sample milling apparatus of FIGS. 1-2.
Figure 32:
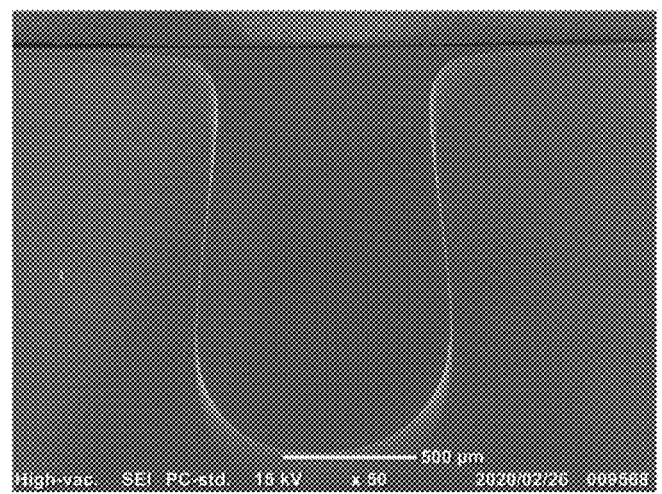
Figure 33:
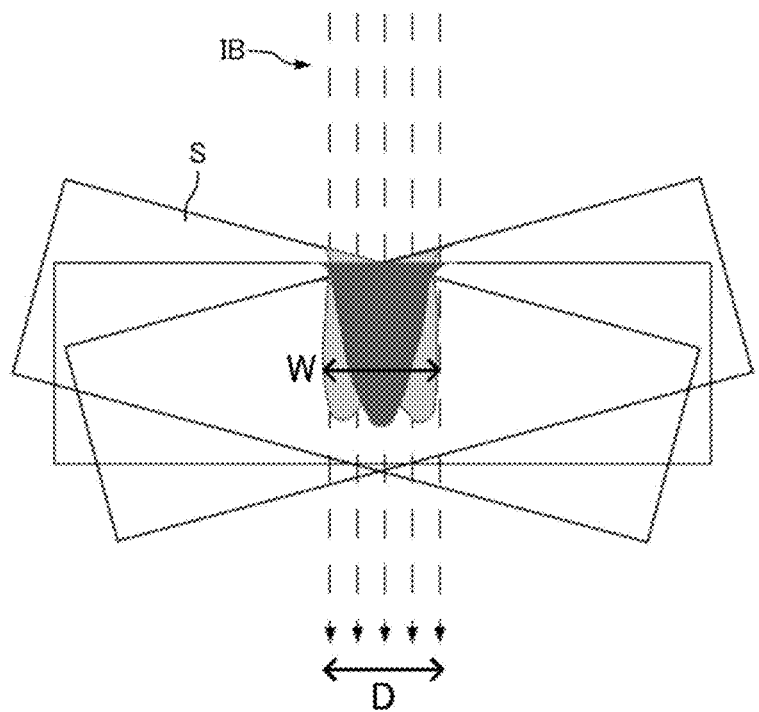
FIG. 33 illustrates a technique for milling a sample that is swung in the novel sample milling apparatus of FIGS. 1-2.
Figure 34:
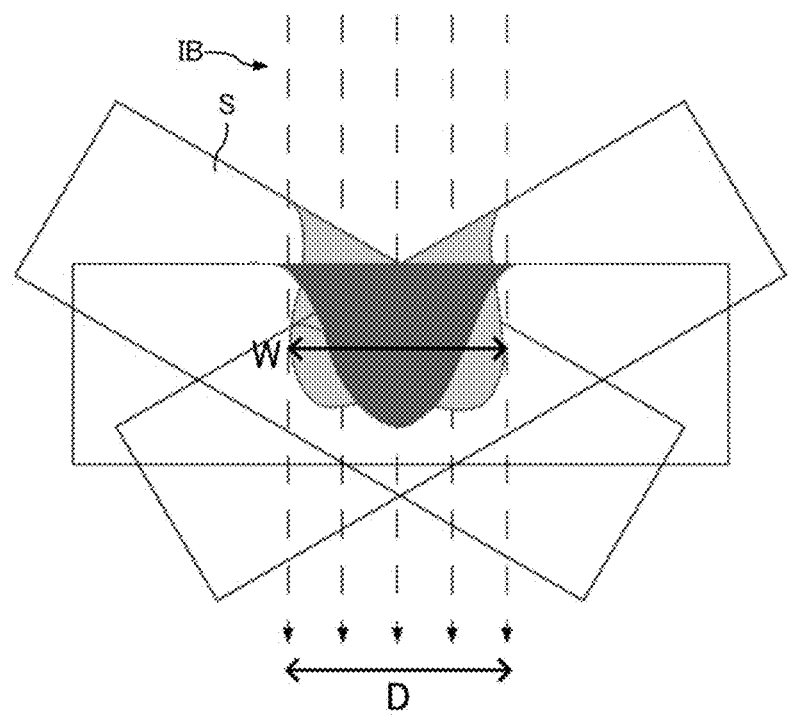
FIG. 34 illustrates a technique for milling a sample that is swung in the conventional sample milling apparatus.
Figure 34:
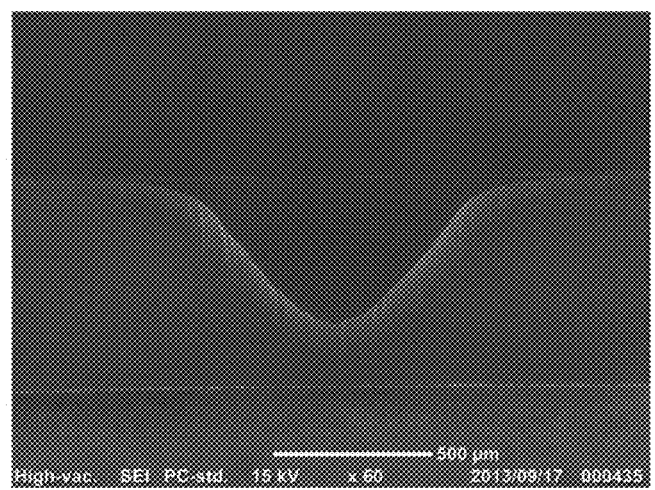

FIGS. 32 and 33 illustrate a technique for milling the sample S while swinging it in the sample milling apparatus 100. FIG. 34 illustrates the technique of milling the sample S while swinging it in the conventional sample milling apparatus of FIG. 4. FIGS. 32-34 illustrate the state of the sample S during milling and SEM photographs of the sample S which has been milled.

In the example shown in FIG. 34, the sample S is made to swing through an angular range of ±30°. At this time, as shown in FIG. 34, the milling width W is nearly equal to the diameter D of the ion beam IB.

On the other hand, in the sample milling apparatus 100, as shown in FIG. 32, in a case where the sample S is swung through an angular range of ±30° by the use of the ion beam IB whose diameter has been reduced using the focusing electrode 140, the milling width W can be made greater than the diameter D of the ion beam IB at deeper positions of the sample S. In the example shown in FIG. 32, the milling width W at deeper positions of the sample S is greater than the milling width W at shallower positions of the sample S.

In the example shown in FIG. 33, the sample S is made to swing through an angular range of ±15°. Furthermore, in the example shown in FIG. 33, the swinging motion is halted at the extreme angular positions of +15° and −15°, respectively. Consequently, the milling width W can be made comparable to the diameter D of the ion beam IB. At the extreme angular positions, the speed of the swinging motion of the sample S can be reduced, in which case the milling width W can be made roughly equal to the diameter D of the ion beam IB in the same manner as where the swinging motion is halted at the extreme angular positions. As a result, the milling rate, for example, in the depthwise direction can be improved. In this way, in the sample milling apparatus 100, the angular range of swinging motion and the focusing voltage can be varied and so the apparatus can mill various samples efficiently.

Figure 35:
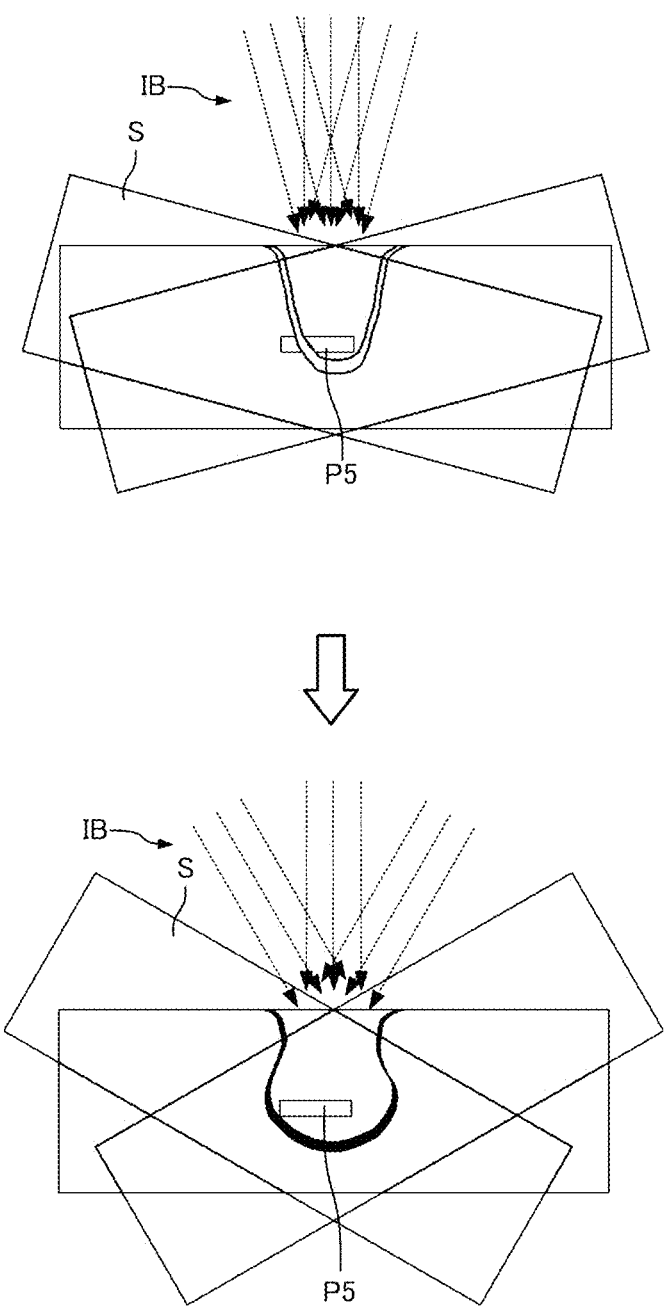
FIG. 35 illustrates a technique for milling a sample that is swung in the novel sample milling apparatus of FIGS. 1-2.

FIG. 35 illustrates a method of milling the sample S that is swung in the sample milling apparatus 100. In this example of FIG. 35, an area including the whole of a target material P5 is set as an area to be milled. As shown, in the initial stage of a milling process, the angle of swinging motion is set small. The milling operation is made to proceed under the condition where the aspect ratio is increased, and a part of the target material P5 is exposed. Then, the angle of swinging motion is increased. The swinging motion is halted or slowed at the extreme angular positions, and the milling width is increased at deeper positions of the sample S. Thus, the whole of the target material P5 is exposed. The target material P5 lying in deep positions of the sample S can be efficiently milled by varying the angle of swinging motion during milling in this way.

1.4. User Interface

In the sample milling apparatus 100, an image or graphical element indicating the diameter (illuminated area) of the ion beam IB and the hit position corresponding to the set focusing voltage, acceleration voltage, discharge voltage, gas flow rate, and other illumination conditions can be superimposed on an image captured by the positioning camera 50. Consequently, the user can easily bring a position where milling is to be done into coincidence with the position hit by the ion beam IB.

In the sample milling apparatus 100, the diameter of the ion beam IB and the hit position vary according to the illumination conditions for the ion beam IB. For example, as the acceleration voltage is increased, the diameter of the ion beam IB decreases. Furthermore, as the focusing voltage applied to the focusing electrode 140 is varied, the diameter of the ion beam varies. In addition, as the acceleration voltage and the focusing voltages are varied, the position hit by the ion beam IB varies.

The image processor 80 has a database in which the illumination conditions for the ion beam IB and information about the diameter of the ion beam IB and about the hit position are stored in an interrelated manner. The image processor 80 retrieves from the database information about the diameter of the ion beam IB and hit position corresponding to the set illumination conditions and displays an image or graphical element indicative of the diameter of the ion beam IB and the hit position.

Figure 36:
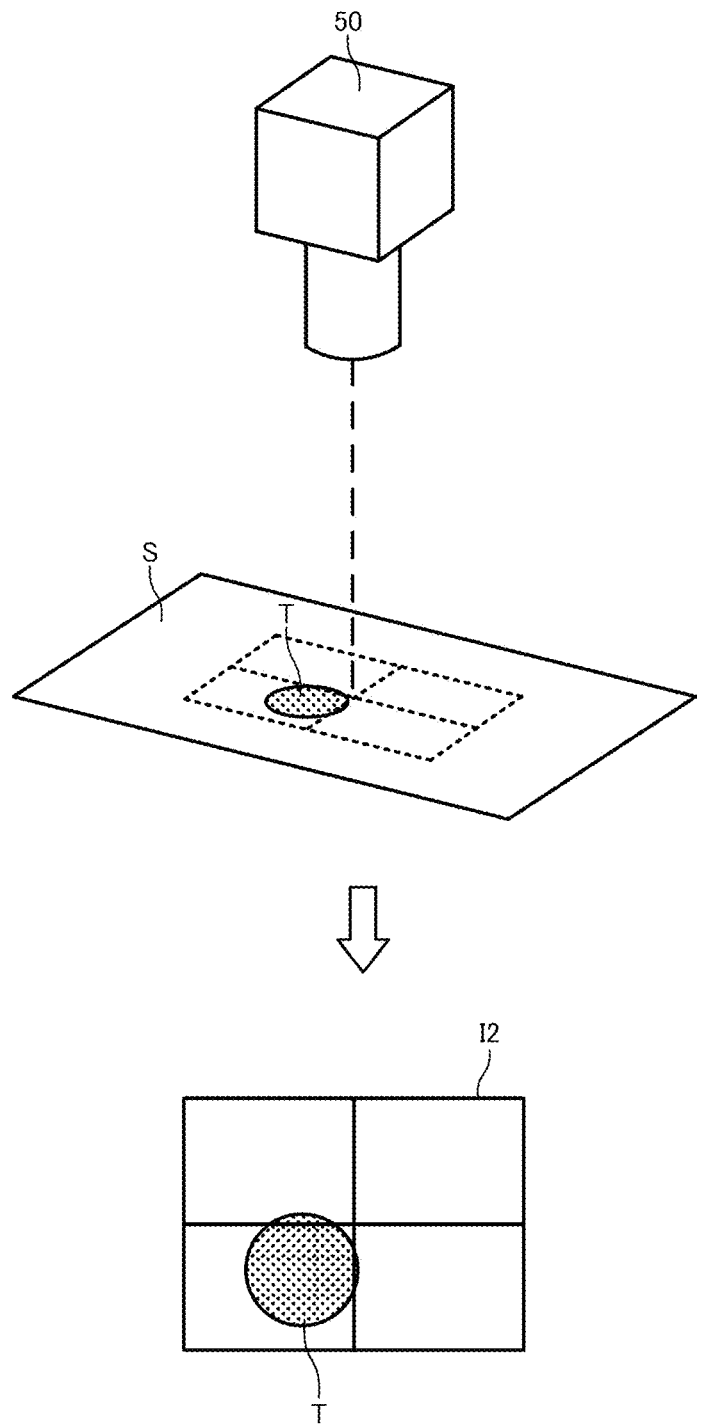
FIG. 36 illustrates a method of creating a database.

FIG. 36 illustrates a method of constructing the database and depicts the manner in which the positioning camera 50 is shooting the sample S, as well as a taken image 12. For example, the illumination conditions are set at will, and the ion beam IB is directed at the sample S for testing. Consequently, as shown in FIG. 36, a trace T of the bombardment by the ion beam IB is produced on the testing sample S.

Then, the testing sample S is photographed with the positioning camera 50 and the image 12 is acquired. Information about the size (contour) and position of the bombardment trace T is then obtained from the acquired image 12. The size of the bombardment trace T corresponds to the diameter of the ion beam IB, and the position of the trace T corresponds to the point of bombardment. Accordingly, the set illumination conditions can be associated with the information about the diameter of the ion beam IB and about the point of bombardment by the ion beam IB. A database can be created by repeating these processing operations while varying the illumination conditions.

Figure 37:
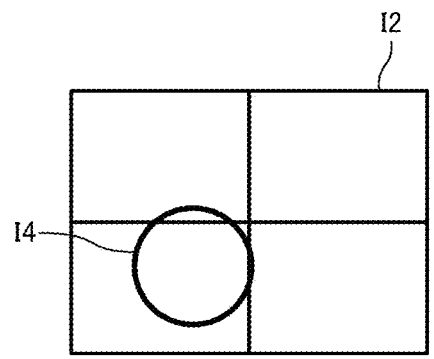
FIG. 37 is a schematic view illustrating processing performed by an image processor.

FIG. 37 illustrates the processing of the image processor 80. If illumination conditions for the ion beam IB are set, the image processor 80 refers to the database and obtains information about the diameter of the ion beam IB and the position hit by the ion beam IB corresponding to the set illumination conditions. Then, the image processor 80 superimposes an image or graphical element 14 indicating the diameter of the beam IB and the hit position over the image 12 captured by the positioning camera 50 based on the obtained information about the diameter of the beam IB and hit position. In the example shown in FIG. 37, a circle having the same diameter as that of the ion beam IB is displayed by the processor 80 as the image or graphical element 14 at the position hit by the ion beam IB. Note that the image or graphical elements 14 are not restricted to the example shown in FIG. 37 as long as it can indicate the diameter of the ion beam IB and the hit position.

In the sample milling apparatus 100, the image processor 80 superimposes the image or graphical entity 14 indicative of the diameter of the ion beam IB and the hit position over the image 12 captured by the positioning camera 50. As a result, the target milling position can be brought into coincidence with the position hit by the ion beam simply by aligning the target milling position with the position of the image or graphical element 14. Therefore, with the sample milling apparatus 100, the target milling position can be easily aligned with the position hit by the ion beam IB.

1.5. Advantageous Effects

The sample milling apparatus 100 includes the focusing electrode 140 disposed between the cathode 120 and the extraction electrode 130. The spatial profile of the ion beam IB is controlled by varying the focusing voltage applied to the focusing electrode 140. In the sample milling apparatus 100, therefore, the sample S can be milled with the ion beam IB having a spatial profile which can vary variously. That is, in the sample milling apparatus 100, the sample S can be milled using the in beam IB whose diameter can be made small or large or whose intensity distribution can be made uniform. Hence, the sample milling apparatus 100 can efficiently mill various samples which widely vary in material or which include targets widely differing in size or depth.

In the sample milling apparatus 100, the spatial profile of the ion beam IB can be controlled, for example, without varying any of the acceleration voltage, discharge voltage, and flow rate of admitted gas as described previously. Therefore, in the sample milling apparatus 100, the ion beam IB can be focused using the focusing electrode 140 even if the acceleration voltage is quite low (i.e., 2 to 3 kV) and the sample S can be milled thereby.

A sample milling method for use in the sample milling apparatus 100 involves the step of controlling the spatial profile of the ion beam IB by varying the focusing voltage applied to the focusing electrode 140. Therefore, in this sample milling method for the milling apparatus 100, various samples which are different in material or which include targets differing in size or depth can be milled efficiently.

Another sample milling method for use in the sample milling apparatus 100 includes the steps of: setting the focusing voltage to a first voltage and directing the ion beam IB at the sample S to mill it; and setting the focusing voltage to a second voltage different from the first voltage and directing the ion beam IB at the sample S to mill it. Therefore, in this sample milling method for use in the sample milling apparatus 100, various samples can be milled efficiently.

2. Second Embodiment

2.1. Sample Milling Apparatus

Figure 38:
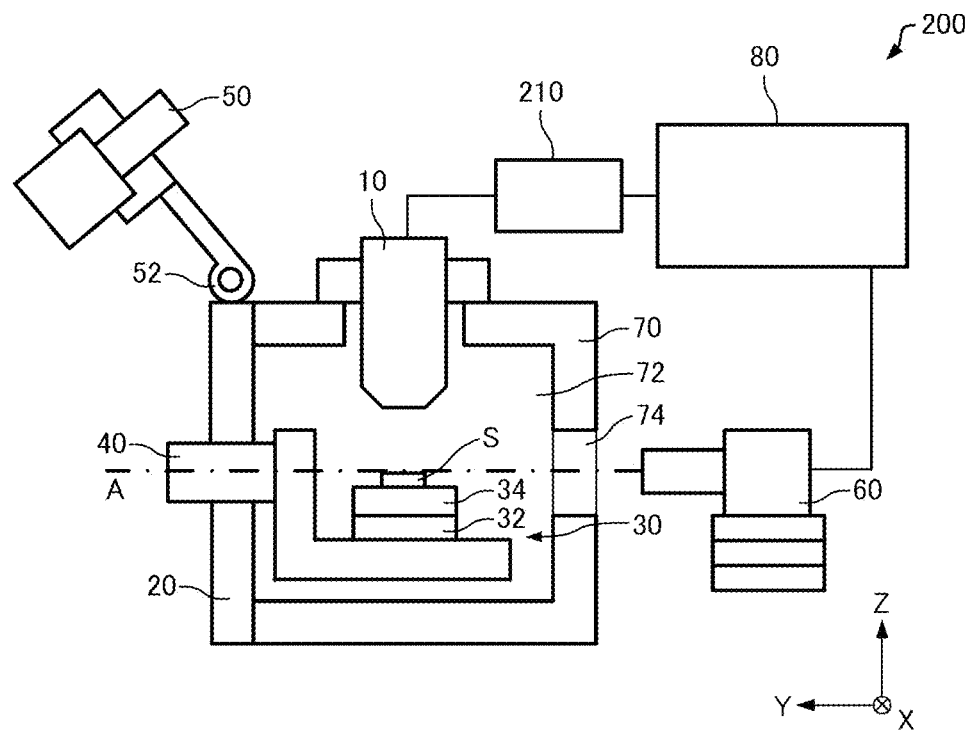
FIG. 38 is a diagram showing the configuration of a sample milling apparatus associated with a second embodiment.

A sample milling apparatus associated with a second embodiment is next described by referring to FIG. 38, which illustrates the configuration of the sample milling apparatus, 200, associated with the second embodiment. Those members of the sample milling apparatus 200 which are similar in function to their counterparts of the sample milling apparatus 100 associated with the first embodiment are indicated by the same reference numerals as in the foregoing drawings and a detailed description thereof is omitted below.

As shown in FIG. 38, the sample milling apparatus 200 includes a controller 210 for controlling the ion source 10. The controller 210 includes a CPU (central processing unit), a RAM (random access memory), and a ROM (read only memory), for example. In the controller 210, the CPU performs various calculational operations and various control operations by executing computer programs stored in the memories.

2.2. Operation

Figure 39:
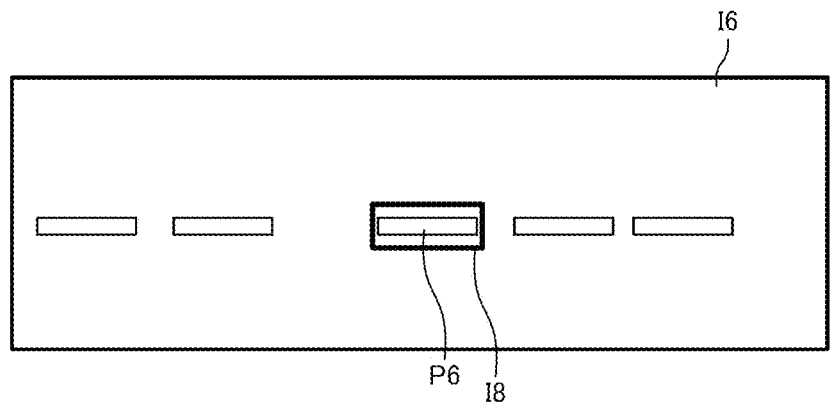
FIGS. 39-41 illustrate one example of processing performed by a controller of the sample milling apparatus of FIG. 38.
Figure 40:
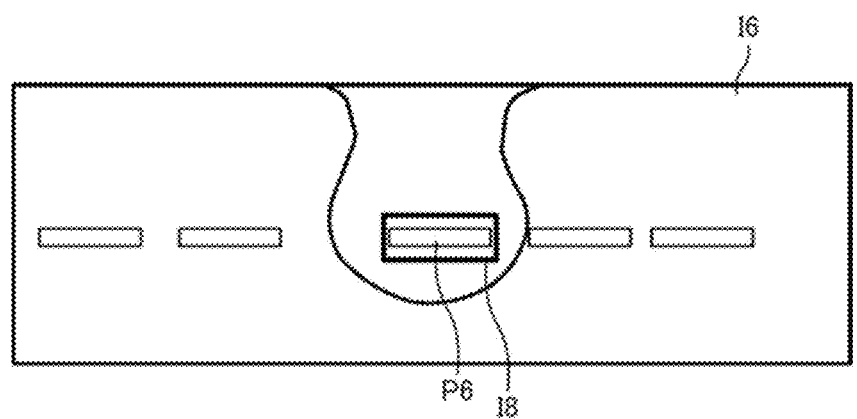
Figure 41:
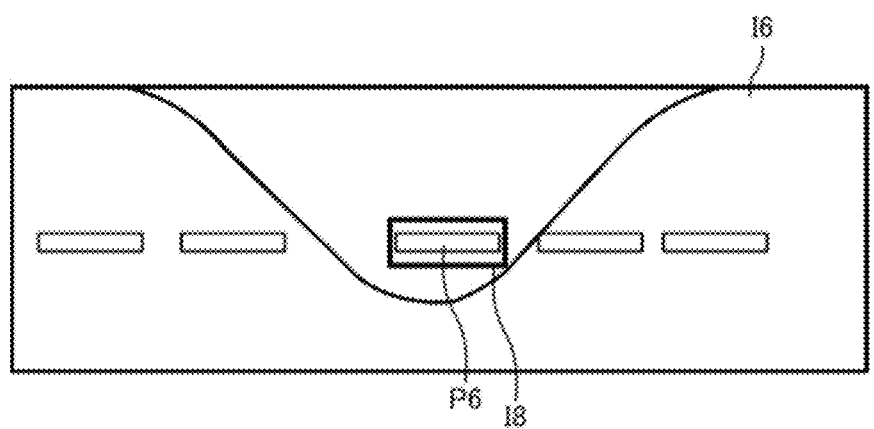

FIGS. 39-41 illustrate one example of processing sequence performed by the controller 210. In the sample milling apparatus 200, the image processor 80 displays a GUI (graphical user interface) screen for specifying a target area to be milled. The GUI screen contains an image 16 captured by the milling observation camera 60, and an image or a graphical element 18 for specifying the position and size of the target area to be milled is superimposed on the captured image 16 as shown in FIG. 39, for example. For instance, the image or graphical element 18 is a frame indicating the position and size of the target area to be milled. The inside of the frame is specified as the target area to be milled. In the illustrated example, an area including the target material P6 is specified by the graphical element 18 as the target area to be milled.

If the target area to be milled is specified, the controller 210 determines milling conditions based on the specified position and size of the target area to be milled. The milling conditions include focusing voltage, acceleration voltage, discharge voltage, and sputtering conditions (such as swing angle and swing speed), for example.

The controller 210 already has a database about shapes achieved by milling under various milling conditions and about milling times. The controller 210 searches the database by the specified width and depth of the target area to be milled and determines a milling condition or conditions. For example, the controller 210 retrieves such a milling condition from the database which minimizes the time taken to mill a cross section of the specified target area to be milled. As illustrated in FIG. 40, the controller 210 finds the shape of the milled cross section of the sample S and the milling time when the sample S is milled under the determined milling condition and displays the found shape of the milled cross section and forecast milling time in the GUI screen.

If the user determines that the milling condition displayed in the GUI screen is not appropriate, he or she can perform a manipulation in the GUI screen to present another milling condition. In response to the manipulation, the controller 210 presents this milling condition as shown in FIG. 41.

Alternatively, the controller 210 may previously display a plurality of candidate milling conditions in the GUI screen and permit the user to select one out of the plural candidate milling conditions. For example, the controller 210 displays a shape of milled cross section and a forecast milling time in the GUI screen for each candidate milling condition. The user may specify one out of the plural candidate milling conditions displayed in the GUI screen.

If the user specifies one milling condition, the controller 210 controls the ion source 10 and swing mechanism 40 based on the specified milling condition. For example, if the focusing voltage is specified as one milling condition, the controller 210 controls the focusing electrode voltage supply 170 such that the specified focusing voltage is applied to the focusing electrode 140.

If a milling operation is performed under a combination of two milling conditions, as shown in FIG. 40, the controller 210 switches the active milling condition based on the image 16 captured by the milling observation camera 60. For example, the sample S is milled under the condition that the swing angle is a first angle under control of the controller 210. Then, the swing angle of the sample S is switched to a second angle at the timing when the milled cross section reaches a preset milling width in the captured image 16. The controller 210 continues the milling until the whole of the specified target area to be milled is exposed.

A tilted area formed at the boundary between the cross section milled by the ion beam IB and the unmilled area can be discriminated from other portions within the image captured with the observation camera 60 by providing coaxial episcopic illumination of the sample S. Therefore, the controller 210 acquires an image where the tilted area can be identified by capturing the episcopically illuminated sample S by the milling observation camera 60. The controller 210 then identifies the geometric dimensions of the milled cross section (such as milling width and the size of the milled cross section) from the image, monitors how the milling is being done, and determines when the active milling condition is switched and when the milling is ended.

In the foregoing description, a case is presented in which a target area to be milled is specified and a milling condition is determined. Alternatively, an area or areas not to be milled may be specified and a milling condition may be determined.

Furthermore, in the foregoing description, a case is presented in which the controller 210 presents candidates of milling conditions to prompt the user to specify one out of the presented candidate milling conditions. The controller 210 may control the ion source 10 and the swing mechanism 40 based on the specified target area to be milled. In this case, the controller 210 may adopt a milling condition or conditions which minimize the milling time and perform the milling.

2.3. Advantageous Effects

The sample milling apparatus 200 includes the controller 210 for controlling the focusing electrode power supply 170. The controller 210 is also operative to accept the designation of a target area of the sample S to be milled and to control the focusing electrode power supply 170 based on the designated target area to be milled. Therefore, in the sample milling apparatus 200, the sample S can be milled with the ion beam IB having an optimum spatial profile. For example, the sample S can be milled with the ion beam IB having a spatial profile that minimizes the milling time.

In the sample milling apparatus 200, the controller 210 controls the swing mechanism 40 based on the specified target area to be milled. Consequently, the sample milling apparatus 200 can mill the sample S efficiently.

3. Modified Embodiments

In the foregoing description of the first and second embodiments, the sample milling apparatus is a Cross Section Polisher (a registered trademark) for preparing a cross section of a sample. The sample milling apparatus may also be an Ion Slicer (a registered trademark) for preparing thin-film specimens. The Ion Slicer is equipped with a shield belt for shielding an ion beam to permit samples to be sliced into thin sections.

It is to be understood that the present invention is not restricted to the embodiments described above and that the invention can be practiced in variously modified forms. For example, the present invention embraces configurations substantially identical to the configurations described in the embodiments. What are meant by substantially identical configurations are configurations identical in functions, method, and results or in purposes and effects, for example. Furthermore, the present invention embraces configurations which are similar to those described in the foregoing embodiments except that nonessential portions have been replaced. In addition, the present invention embraces configurations which are identical in yielded advantageous effects or achieved purposes to the configurations described in the foregoing embodiments. Further, the present invention embraces configurations similar to those described in the foregoing embodiments except that a well-known technique is added.

The invention claimed is:

1. A sample milling apparatus for milling a sample by irradiating the sample with an ion beam, said sample milling apparatus comprising:
   an anode;
   a cathode configured to emit electrons which are made to collide with gas molecules so that ions are generated;

an extraction electrode configured to cause the generated ions to be extracted as said ion beam, wherein said ion beam has a spatial profile that is controlled by varying a focusing voltage applied to a focusing electrode;

the focusing electrode disposed between the cathode and the extraction electrode and applied with the focusing voltage;

a swing mechanism configured to swing the sample; and a controller configured to:
control the focusing voltage applied to the focusing electrode and a swing angle when the sample is swung;
accept designation of a target area to be milled and determine a milling condition comprising the focusing voltage and the swing angle based on a shape of the designated target area to be milled; and
control the swing mechanism so that the sample is repeatedly swung at the swing angle corresponding to the milling condition while the sample is illuminated with the ion beam, the spatial profile of the ion beam having been controlled by applying the focusing voltage corresponding to the milling condition to the focusing electrode.

2. The sample milling apparatus as set forth in claim 1, further comprising:
a focusing voltage source configured to apply the focusing voltage to said focusing electrode;
wherein the controller is further configured to control the focusing voltage source.

3. The sample milling apparatus as set forth in claim 2, wherein said controller is further configured to
control said focusing voltage source based on the designated target area to be milled.

4. A sample milling method using a sample milling apparatus comprising an anode, a cathode for emitting electrons which are made to collide with gas molecules so that ions are generated, an extraction electrode for causing the generated ions to be extracted as an ion beam, a focusing electrode disposed between the cathode and the extraction electrode and applied with a focusing voltage, and a swing mechanism configured to swing a sample, the sample milling apparatus operating to mill the sample by irradiating the sample with the ion beam having a spatial profile, said sample milling method comprising:
controlling the spatial profile of the ion beam by varying the focusing voltage applied to the focusing electrode;
determining a milling condition including the focusing voltage applied to the focusing electrode and a swing angle when the sample is swung based on a shape of a target area of the sample to be milled; and
controlling the swing mechanism so that the sample is repeatedly swung at the swing angle corresponding to the determined milling condition while the sample is illuminated with the ion beam, the spatial profile of the ion beam having been controlled by applying the focusing voltage corresponding to the determined milling condition to the focusing electrode.

5. The sample milling method as set forth in claim 4, further comprising the steps of:
setting said focusing voltage to a first voltage and irradiating said sample with said ion beam to mill the sample; and
setting the focusing voltage to a second voltage different from the first voltage and irradiating the sample with the ion beam to mill the sample.

6. The sample milling apparatus as set forth in claim 1, further comprising:
a database comprising a plurality of milling conditions and a plurality of milling shapes, wherein the controller is further configured to:
search the database by the shape of the designated target area to be milled; and
determine the milling condition.

7. The sample milling apparatus of claim 6, wherein the controller is further configured to:
find a milling shape when the sample is milled under the milling condition; and
display the milling shape in a display section.

8. The sample milling apparatus as set forth in claim 1, wherein the controller is further configured to:
determine a combination of a plurality of milling conditions based on the shape of the designated target area to be milled, wherein a first swing angle in a first milling condition of the plurality of milling conditions is different from a second swing angle in a second milling condition of the plurality of milling conditions.

9. The sample milling method as set forth in claim 4, wherein determining the milling condition further comprises:
searching a database to determine the milling condition, the database comprising a plurality of milling conditions and a plurality of milling shapes.

10. The sample milling method as set forth in claim 9, further comprising:
finding a milling shape when the sample is milled under the milling condition; and
displaying the milling shape in a display section.

11. The sample milling method as set forth in claim 4, further comprising:
setting the swing angle at a first swing angle, causing the sample to be repeatedly swung at the first swing angle and milling the sample while the sample is illuminated with the ion beam; and
setting the swing angle to a second swing angle which is different from the first swing angle, causing the sample to be repeatedly swung at the second swing angle and milling the sample while the sample is illuminated with the ion beam.

* * * * *